United States Patent
Miguelanez et al.

(10) Patent No.: US 8,417,477 B2
(45) Date of Patent: Apr. 9, 2013

(54) METHODS AND APPARATUS FOR LOCAL OUTLIER DETECTION

(75) Inventors: Emilio Miguelanez, Edinburgh (GB); Jacky Gorin, Scottsdale, AZ (US); Eric Paul Tabor, Gilbert, AZ (US)

(73) Assignee: Test Acuity Solutions, Inc., Tempe, AZ (US)

( * ) Notice: Subject to any disclaimer, the term of this patent is extended or adjusted under 35 U.S.C. 154(b) by 822 days.

(21) Appl. No.: 11/134,843

(22) Filed: May 20, 2005
(Under 37 CFR 1.47)

(65) Prior Publication Data

US 2006/0085155 A1 Apr. 20, 2006

Related U.S. Application Data

(63) Continuation-in-part of application No. 10/817,750, filed on Apr. 2, 2004, now Pat. No. 7,395,170, which is a continuation-in-part of application No. 10/730,388, filed on Dec. 7, 2003, now Pat. No. 7,225,107, which is a continuation-in-part of application No. 10/367, 355, filed on Feb. 14, 2003, now Pat. No. 7,167,811, which is a continuation-in-part of application No. 10/154,627, filed on May 24, 2002, now Pat. No. 6,792,373, which is a continuation-in-part of application No. 09/872,195, filed on May 31, 2001, now Pat. No. 6,782,297.

(60) Provisional application No. 60/293,577, filed on May 24, 2001, provisional application No. 60/295,188, filed on May 31, 2001, provisional application No. 60/603,312, filed on Aug. 20, 2004, provisional application No. 60/374,328, filed on Apr. 21, 2002, provisional application No. 60/483,003, filed on Jul. 27, 2003, provisional application No. 60/546,088, filed on Feb. 19, 2004.

(51) Int. Cl.
*G06F 19/00* (2011.01)

(52) U.S. Cl.
USPC .......................................................... 702/118

(58) Field of Classification Search .................. 702/118
See application file for complete search history.

(56) References Cited

U.S. PATENT DOCUMENTS

| | | |
|---|---|---|
| 5,240,866 A | 8/1993 | Friedman et al. |
| 5,568,591 A | 10/1996 | Minot et al. |
| 5,787,190 A | 7/1998 | Peng et al. |
| 5,835,891 A | 11/1998 | Stoneking |

(Continued)

FOREIGN PATENT DOCUMENTS

| | | |
|---|---|---|
| JP | 08-032281 A | 2/1996 |
| JP | 2009-0708334 A | 4/2009 |

OTHER PUBLICATIONS

T. Fountain, T. Dietterich, and B. Sudyka. Mining IC test data to optimize VLSI testing. The 6th ACM SIGKDD International Conference pp. 18-25, 2000.

(Continued)

*Primary Examiner* — Aditya Bhat
(74) *Attorney, Agent, or Firm* — The Noblitt Group, PLLC

(57) ABSTRACT

A method and apparatus for data analysis according to various aspects of the present invention is configured to identify statistical outliers in test data for components, including local outliers representing outliers within subsets of larger data populations.

40 Claims, 28 Drawing Sheets

U.S. PATENT DOCUMENTS

| | | | |
|---|---|---|---|
| 6,184,048 B1* | 2/2001 | Ramon | 438/14 |
| 6,477,685 B1 | 11/2002 | Lovelace | |
| 6,516,309 B1 | 2/2003 | Eberhart | |
| 6,574,760 B1* | 6/2003 | Mydill | 714/724 |
| 6,782,500 B1* | 8/2004 | Madge et al. | 714/738 |
| 6,787,379 B1 | 9/2004 | Madge et al. | |
| 6,807,655 B1 | 10/2004 | Rehani et al. | |
| 6,939,727 B1 | 9/2005 | Allen, III et al. | |
| 6,943,042 B2 | 9/2005 | Madge et al. | |
| 2003/0011376 A1 | 1/2003 | Matsushita | |
| 2003/0014205 A1 | 1/2003 | Tabor | |
| 2004/0006447 A1 | 1/2004 | Gorin | |
| 2004/7006446 | 4/2004 | Yadav et al. | |

OTHER PUBLICATIONS

N. Franken and A.P. Engelbrecht. Comparing PSO structures to learn the game of checkers from zero knowledge. In Congress on Evolutionary Computation, vol. 1, Dec. 2003.

F. van den Bergh and A. P. Engelbrecht, "Cooperative Learning in Neural Networks using Particle Swarm Optimizers", South African Computer Journal, pp. 84-90, Nov. 2000.

F. van den Bergh and A. P. Engelbrecht, "Training Product Unit Networks using Cooperative Particle Swarm Optimisers", in Proceedings of IJCNN 2001, (Washington DC, USA), 2001.

K. W. Tobin, S. S. Gleason, T. P. Karnowski, S. L. Cohen and F. Lakhani, Automatic Classification of Spatial Signatures on Semiconductor Wafermaps. SPIE 22nd Annual (1997).

S.S. Gleason, K.W. Tobin, T.P. Karnowski, and Fred Lakhani, (1999) Rapid Yield Learning through Optical Defect and Electrical Test Analysis, SPIE, 1999.

Hu M. K. "Visual pattern recognition by moments invariants", IRE Transactions on Information Theory, vol. 8(2), pp. 179-187, 1962.

The National Technology Roadmap for Semiconductors, Semiconductor Industry Association, San Jose, 2001 (Executive Summary).

The National Technology Roadmap for Semiconductors, Semiconductor Industry Association, San Jose, 2001 (Test and Test Equipment).

K. Kameyama, and Y. Kosugi, "Semiconductor Defect Classification using Hyperellipsoid Clustering Neural Networks and Model Switching", Intl Joint Conf on Neural Networks 1999.

T.P. Karnowskl, K.W. Tobin, S.S. Gleason, Fred Lakhani, "The Application of Spatial Signature Analysis to Electrical Test Data: Validation Study," SPIE 24th Ann'l Symp Feb. 1999.

J. Kennedy and R. Mendes. Population structure and particle swarm performance. In Congress on Evolutionary Computation, pp. 1671-1676, 2002.

J. Kennedy and R. Mendes. Neighborhood topologies in fully-informed and best-of-neighborhood particle swarms. IEEE Int'l Workshop on Soft Computing Jul. 2003.

Kohonen T., The self-organizing map. Proceedings of the IEEE 78, pp. 1464-1480, 1990.

Kveton and D. Dash. Automatic excursion detection in manufacturing: Preliminary results. 18th Int'l Florida Artificial Intelligence Research Conference May 2004.

Lanzi, P. L., "Fast Feature Selection with Genetic Algorithms: A Fitter Approach", IEEE International Conference on Evolutionary Computation , Apr. 13-16, 1997, pp. 537-540.

Leonardis and H. Bischof, "An efficient MDL-based construction of RBF networks", Neural Networks, vol. 11, pp. 963-973, 1998.

Y. Liu, X. Yao and T. Higuchi, "Evolutionary Ensembles with Negative Correlation Learning", in IEEE Transactions on Evolutionary Computation, 4(4): 380-387, Nov. 2000.

R. Mendes, J. Kennedy, and J. Neves. Watch thy neighbor or how the swarm can learn from its environment. IEEE Swarm Intelligence Symposium, pp. 88-94, Apr. 24-26, 2003.

R. Mendes, J. Kennedy, and J. Neves. The Fully Informed Particle: Simpler, Maybe Better. IEEE Transaction on Evolutionary Computation, 8:204-210, Jun. 2004.

Miguelanez, Emilio, DIWA: Device Independent Wafermap Analysis, 2003.

Miguelanez, Emilio, DIWA: Device Independent Wafermap Analysis, 2003 (Presentation).

Miguelanez, Emilio, Automating the Analysis of Wafer Data Using Adaptive Resonance Theory Networks, 2004 (Presentation).

Miguelanez, Emilio, Evolving Neural Networks using Swarm Intelligence for Binmap Classification, 2004.

Miguelanez, Emilio, Automating the Analysis of Wafer Data Using Adaptive Resonance Theory Networks, 2004.

Miguelanez, Emilio, Evolving Neural Networks using Swarm Intelligence for Binmap Classification, 2004 (Presentation).

Miguelanez, Emilio, Swarm Intelligence in Automated Electrical Wafer Sort Classification, 2005.

T. Nakashlma, G. Nakal, and H. Ishlbuchl. Constructing fuzzy ensembles for pattern classification problems. IEEE Intl Conf on Systems, Man and Cybernetics, Oct. 2003.

Neblett. The role of test in total quality management. In Proceedings of the IEEE Systems Readiness Technology Conference Autotestcon'94, vol. I, pp. 727-735, Sep. 1994.

Ozcan and C.K. Mohan. Particle swarm optimization: Surfing the waves. In International Congress on Evolutionary Computation, pp. 1939-1944, 1999.

K. E. Persopoulos and M. N. Vrahatis. On the Computation of All Global Minimizers through Particle Swarm Optimization. IEEE Transaction on Evolutionary Computation, Jun. 2004.

T. Poggio and F. Girosi, "Networks for approximation and learning", Proc. of the IEEE, vol. 78, pp. 1481-197, 1990.

J. Salerno, "Using the particle swarm optimization technique to train a recurrent neural model", IEEE Inter. Conference on Tools with Artificial Intelligence, pp. 45-49, 1997.

Y. Shi and R.C. Eberhart, "Parameter selection in particle swarm optimization", in Proc. of the 1998 Annual Conference on Evolutionary Programming, San Diego, CA, 1998.

Y. Shi and R. C. Eberhart. "A Modified Particle Swarm Optimizer", in Proc. of Intl. Joint Conf. on Neural Networks, Washington, USA, pp. 69-73, Jul. 1999.

K. W. Tobin, S. S. Gleason, T. P. Karnowski, An Image Paradigm for Semiconductor Defect Data Reduction, SPIE's International Symposium on Microlithography, 1996.

K.W. Tobin, S.S. Gleason, F. Lakhami, and M.H. Bennet, "Automated Analysis for Rapid Defect Sourcing and Yield Learning", Future Fab International, vol. 4, 1997.

K.W. Tobin, S. S.Gleason, T.P. Karnowski, and S.L. Cohen, Feature Analysis and classification of Manufacturing Signatures on Semiconductor Wafers. SPIE 9th Annual, 1997.

K. W. Tobin, S. S. Gleason. T. P. Karnowski, S. L. Cohen and F. Lakhani, Automatic Classification of Spatial Signatures on Semiconductor Wafermaps, SPIE 22nd Annual, 1997.

Tseng, L. Y. and Yang, S. B., "Genetic Algorithms for Clustering, Feature Selection and Classification", International Conference on Neural Networks, Jun. 9-12, 1997.

Vafaie, H. and De Jong, K., "Genetic Algorithms as a Tool for Feature Selection in Machine Learning",4th Int'l Conf on Tools with Artificial Intelligence, Nov. 1992.

Watkins and L. Boggess. A new classifier based on resource limited Artificial Immune Systems. In Congress on Evolutionary Computation CEC'02, vol. II pp. 1546-1551. IEEE May 2002.

C. Zhang, H. Shao, and Y.Li, "Particle swarm optimization for evolving artificial neural networks", IEEE Int'l Conf on Systems, Man and Cybernetics vol. 4, 2000.

Madge, Robert, et al. Statistical Post-Processing at Wafersort—An Alternative to Burn-In and a Manufacturabie Solution to Test Limit Setting for Sub-Micron . . . , IEEE 2002.

Motorola, Process Average Testing (PAT), Statistical Yield Analysis (SYA) and Junction Verification Test (JVT), Aug. 3, 1998.

Singh et al., Screening for Known Good Die (KGD) Based on Defect Clustering: An Experimental Study, IEEE.

Singh, Position Statement: Good Die in Bad Neighborhoods, IEEE.

Miller, Position Statement: Good Die in Bad Neighborhoods, IEEE.

Roehr, Position Statement: Good Die in Bad Neighborhoods, IEEE.

Mann, "Leading Edge" of Wafer Level Testing.

Michelson, Statistically Calculating Reject Limits at Parametric Test, IEEE.

Sabade et al., Immediate Neighbor Difference IDDQ Test (INDIT) for Outlier Detection, Dept. of Computer Science—Texas A&M University.

Huang, et al., Image Processing Techniques for Wafer Defect Cluster Identification, IEEE.

Sabade, et al., Use of Multiple IDDQ Test Metrics for Outlier Identification, Dept. of Computer Science —Texas A&M University.

Chen, et al., A Neural-Network Approach to Recognize Defect Spatial Pattern in Semiconductor Fabrication, IEEE.

Sapozhnikova, et al., The Use of dARTMAP and Fuzzy Artmap to Solve the Quality Testing Task in Semiconductor Industry, IEEE.

Sikka, Automated Feature Detection & Characterization in Sort Wafer Maps.

Hansen, et al., Process Improvement Through the Analysis of Spatially Clustered Defects on Wafer Maps.

Denby, et al., Graphical User Interface for Spatial Data Analysis in Integrated Circuit Manufacturing, AT&T Bell Laboratories.

Friedman, et al., Model-Free Estimation of Defect Clustering in Integrated Circuit Fabrication.

Hansen, et al., Monitoring Wafer Map Data From Integrated Circuit Fabrication Processes for Spatially Clustered Defects.

Xu, Statistical Problems in Semiconductor Manufacturing.

Thomas Gnieting, Measurement Related and Model Parameter Related Statistics.

Agilent PDG-WLR(tm) Test and Analysis Software Environment—Product Note, Agilent Technologies, 2000.

Advance Parametric Tester with HP SPECS, Hewlett-Packard Company, 1999.

Jeff Chappell, LSI Applies Statistics to Defectivity, Apr. 14, 2003 (http://www.reed-electronics.com/electronicnews/index.asp?layout=articlePrint&articieID=CA292185).

Erik Jan Marinissen, et al., Creating Value Through Test, IEEE 2003, 1530-1591.

Russell B. Miller, et al., Unit Level Predicted Yield: a Method of Identifying High Defect Density Die at Wafer Sort, IEEE 2001, 1118-1127.

Philippe Lejeune, et al., Optimizing Yield vs. DPPM for Parts Average Testing, www.galaxysemi.com.

Emilio Miguelanez, et al., Advanced Automatic Parametric Outlier Detection Technologies for the Production Environment.

Guidelines for Part Average Testing, Automotive Electronics Council, AEC-Q001-Rev-C Jul. 18, 2003.

Zinke, Kevin, et al. Yield Enhancement Techniques Using Neural Network Pattern Detection, IEEE 1997, 211-215.

Lejeune, Philippe et al., Minimizing Yield Loss with Parts Average Testing (PAT) and Other DPM Reduction Techniques, Tetradyne Users Group, 2006.

Lejeune, Philippe et al., Minimizing Yield Loss with Parts Average Testing (PAT) and Other DPM Reduction Techniques (Presentation), Tetradyne Users Group, 2006.

Defecter(tm)II—Defect Data Analysis Software, Semicon.

Stanley, James, Spatial Outlier Methods for Detecting Defects in Semiconductor Devices at Electrical Probe, Motorola.

Ratcliffe, Jeff, Setting a Nearest Neighbor IDDQ Threshold.

Daasch, Robert, Variance Reduction Using Wafer Patterns in Iddq Data, Proceeding of International Test Conference Oct. 2000, pp. 189-198.

Daasch, Robert, Neighbor Selection for Variance Reduction in Iddq and Other Parametric Data, ITC International Test Conference, IEEE 2001.

Applewhite. The view from the top. IEEE Spectrum, 41(II (INT)):18-31, Nov. 2004.

Canuto, M. Fairhurst and G. Howells, (2001) Improving ARTMap learning through variable vigilance. International Journal of Neural Systems, vol. 11, No. 6, pp. 509-522.

Carpenter, G. A. and S. Grossberg, (1998) The ART of adaptive pattern recognition by self-organization neural network. Computer, vol. 21, No. 3, pp. 77-88.

K. Chang and J. Ghosh. Principal Curve Classifier—A nonlinear approach to pattern classification. In IEEE World Congress on Computational Intelligence, Neural . . . May 1998.

M. Clerc and J. Kennedy. The particle swarm—explosion, stability, and convergence in a multidimensional complex space. IEEE Transaction on Evolutionary Computation, Feb. 2002.

R. C. Eberhart and J. Kennedy, "A new optimizer using particle swarm theory", in Proc. 6th Intl. Symposium on Micro Machines and Human Science, Nagoya, Japan, IEEE 1995.

R. C. Eberhart and Y. Shl. Evolving Artificial Neural Networks. In International Conference on Neural Networks and Brain, pp. PL5-PL 13, Beijing, P.R. China, 1998.

R. C. Eberhart and X. Hu, "Human Tremor analysis using particle swarm optmization", in Proc. Congress on Evolutionary Computation 1999, IEEE Service Center, pp. 1927-1930.

R.C. Eberhart and Y. Shi, "Comparing inertia weight and constriction factors in particle swarm optimization", in Proc. of the Congress of Evolutionary Computation, 2000.

F. Chen and S. Liu, "A Neural-Network Approach to Recognize Defect Spatial Pattern in Semiconductor Fabrication", IEEE Transactions on Semiconductor ManufacturIng,v.13 2000.

Pitts, John. A KGD Enabler: Full Wafer Contact Technology. 11th Annual Int'l KGD Packaging and Test Workshop, Sep. 12-15, 2004.

Secrest, Jerry. Reducing KGD Test Cost Via Prediction Testing. Secrest Research, KGD Workshop, Sep. 2002.

* cited by examiner

RESISTIVITY PROFILE

☐ = DEVICES THAT HAVE VALUES MATCHING THE DEFINITION_VALUE
☐ n = GROUP INDEX

METHODS AND APPARATUS FOR LOCAL OUTLIER DETECTION

CROSS-REFERENCES TO RELATED APPLICATIONS

This application is:

a continuation-in-part of U.S. patent application Ser. No. 10/817,750, filed on Apr. 2, 2004, now U.S. Pat. No. 7,395,170 entitled METHODS AND APPARATUS FOR ANALYZING TEST DATA, which is a continuation-in-part of U.S. patent application Ser. No. 10/730,388, filed on Dec. 7, 2003, now U.S. Pat. No. 7,225,107 entitled METHODS AND APPARATUS FOR DATA ANALYSIS, which is a continuation-in-part of U.S. patent application Ser. No. 10/367,355, filed on Feb. 14, 2003, now U.S. Pat. No. 7,167,811 entitled METHODS AND APPARATUS FOR DATA ANALYSIS, which is a continuation-in-part of U.S. patent application Ser. No. 10/154,627, filed on May 24, 2002, now U.S. Pat. No. 6,792,373 entitled METHODS AND APPARATUS FOR SEMICONDUCTOR TESTING, which is a continuation-in-part of U.S. patent application Ser. No. 09/872,195, filed on May 31, 2001, now U.S. Pat. No. 6,782,297 entitled METHODS AND APPARATUS FOR DATA SMOOTHING, which claims the benefit of U.S. Provisional Patent Application No. 60/293,577, filed May 24, 2001, entitled METHODS AND APPARATUS FOR DATA SMOOTHING; U.S. Provisional Patent Application No. 60/295,188, filed May 31, 2001, entitled METHODS AND APPARATUS FOR TEST DATA CONTROL AND ANALYSIS; and U.S. Provisional Patent Application No. 60/374,328, filed Apr. 21, 2002, entitled METHODS AND APPARATUS FOR TEST PROGRAM ANALYSIS AND ENHANCEMENT; and which claims the benefit of U.S. Provisional Patent Application No. 60/483,003, filed Jun. 27, 2003, entitled DEVICE INDEPENDENT WAFERMAP ANALYSIS, and of U.S. Provisional Patent Application No. 60/546,088, filed Feb. 19, 2004, entitled DYNAMIC OUTLIER ALGORITHM SELECTION FOR QUALITY IMPROVEMENT AND TEST PROGRAM OPTIMIZATION; and claims the benefit of U.S. Provisional Patent Application No. 60/603,312, filed Aug. 20, 2004, entitled Methods and Apparatus for Semiconductor Testing and Local Outlier Detection; and and incorporates the disclosure of each application by reference. To the extent that the present disclosure conflicts with any referenced application, however, the present disclosure is to be given priority.

BACKGROUND OF THE INVENTION

Semiconductor companies test components to ensure that the components operate properly. The test data not only determine whether the components function properly, but also may indicate deficiencies in the manufacturing process. Accordingly, many semiconductor companies analyze the collected data from several different components to identify and correct problems. For example, the company may gather test data for multiple chips on each wafer among several different lots. Test data may come from a variety of sources, such as parametric electrical testing, optical inspection, scanning electron microscopy, energy dispersive x-ray spectroscopy, and focused ion beam processes for defect analysis and fault isolation. This data may be analyzed to identify common deficiencies or patterns of defects or identify parts that may exhibit quality and performance issues and to identify or classify user-defined "good parts". Steps may then be taken to correct the problems. Testing is typically performed before device packaging (at wafer level) as well as upon completion of assembly (final test).

Gathering and analyzing test data is expensive and time consuming. Automatic testers apply signals to the components and read the corresponding output signals. The output signals may be analyzed to determine whether the component is operating properly. Each tester generates a large volume of data. For example, each tester may perform 200 tests on a single component, and each of those tests may be repeated 10 times. Consequently, a test of a single component may yield 2000 results. Because each tester is testing 100 or more components an hour and several testers may be connected to the same server, the test process generates an enormous amount of data.

The analysis of the gathered data is also difficult. The volume of the data may demand significant processing power and time. As a result, the data is not usually analyzed at product run time, but is instead typically analyzed between test runs or in other batches. To alleviate some of these burdens, some companies only sample the data from the testers and discard the rest. Analyzing less than all of the data, however, ensures that the resulting analysis cannot be fully complete and accurate. As a result, sampling degrades the complete understanding of the test results.

In addition, even when the full set of test data generated by the tester is retained, the sheer volume of the test data presents difficulties in analyzing the data and extracting meaningful results. The data may contain significant information about the devices, the testing process, and the manufacturing process that may be used to improve production, reliability, and testing. In view of the amount of data, however, isolating and presenting the information to the user or another system is challenging.

BRIEF DESCRIPTION OF THE DRAWING

A more complete understanding of the present invention may be derived by referring to the detailed description and the claims when considered in connection with the following illustrative figures, which may not be to scale. Like reference numbers refer to similar elements throughout the figures.

Elements in the figures are illustrated for simplicity and clarity and have not necessarily been drawn to scale. For example, the connections and steps performed by some of the elements in the figures may be exaggerated or omitted relative to other elements to help to improve understanding of embodiments of the present invention.

DETAILED DESCRIPTION OF EXEMPLARY EMBODIMENTS

The present invention may be described in terms of functional block components and various process steps. Such functional blocks and steps may be realized by any number of hardware or software components configured to perform the specified functions. For example, the present invention may employ various testers, processors, storage systems, processes, and algorithms, e.g., statistical engines, memory elements, signal processing elements, logic elements, proximity analysis engines, programs, and the like, which may carry out a variety of functions under the control of one or more testers, microprocessors, or other control devices. In addition, the present invention may be practiced in conjunction with any number of test environments, and each system described is merely one exemplary application for the invention. Further, the present invention may employ any number of conventional techniques for data analysis, component interfacing, data processing, component handling, and the like.

Figure 1:
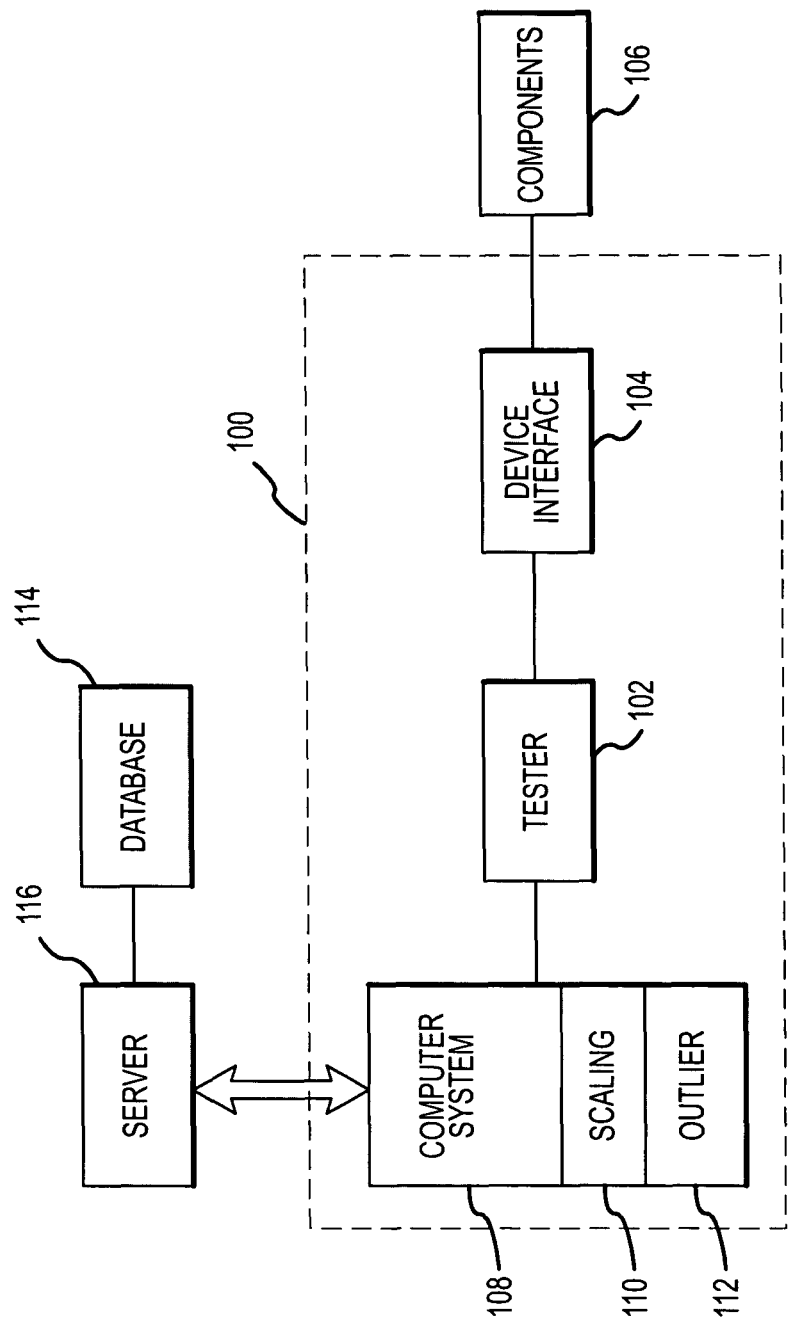
FIG. 1 is a block diagram of a test system according to various aspects of the present invention and associated functional components.

Referring to FIG. 1, a method and apparatus according to various aspects of the present invention operates in conjunction with a test system 100 having a tester 102, such as automatic test equipment (ATE) for testing semiconductors. In the present embodiment, the test system 100 comprises the tester 102 and a computer system 108. The test system 100 may be configured for testing any components 106, such as semiconductor devices on a wafer, circuit boards, packaged devices, or other electrical or optical systems. In the present embodiment, the components 106 comprise multiple integrated circuit dies formed on a wafer or packaged integrated circuits or devices. The components 106 are created using a fabrication process, which may comprise any suitable manufacturing process for creating the components 106, and may include a test process, which may comprise any suitable process for testing the operation of the components 106.

The tester 102 suitably comprises any test equipment that tests components 106 and generates output data relating to the testing, and may comprise multiple machines or other sources of data. The tester 102 may comprise a conventional automatic tester and suitably operates in conjunction with other equipment for facilitating the testing. The tester 102 may be selected and configured according to the particular components 106 to be tested and/or any other appropriate criteria.

The tester 102 may operate in conjunction with the computer system 108 to, for example, program the tester 102, load and/or execute the test program, collect data, provide instructions to the tester 102, analyze test data, control tester parameters, and the like. In the present embodiment, the computer system 108 receives tester data from the tester 102 and performs various data analysis functions independently of the tester 102. The computer system 108 may comprise a separate computer, such as a personal computer or workstation, connected to or networked with the tester 102 to exchange signals with the tester 102. In an alternative embodiment, the computer system 108 may be omitted from or integrated into other components of the test system 100, and various functions may be performed by other components, such as the tester 102 or elements connected to the network.

The test system 100 may include additional equipment to facilitate testing of the components 106. For example, the present test system 100 includes a device interface 104, like a conventional device interface board and/or a device handler or prober, to handle the components 106 and provide an interface between the components 106 and the tester 102. The test system 100 may include or be connected to other components, equipment, software, and the like to facilitate testing of the components 106 according to the particular configuration, application, environment of the test system 100, or other relevant factors. For example, in the present embodiment, the test system 100 is connected to an appropriate communication medium, such as a local area network, intranet, or global network like the internet, to transmit information to other systems, such as the remote server 116.

The test system 100 may include one or more testers 102 and one or more computers 108. Further, the computer 108 may be separate from the tester 102, or may be integrated into the tester 102, for example utilizing one or more processors, memories, clock circuits, and the like of the tester 102 itself. In addition, various functions may be performed by different computers.

A test system 100 according to various aspects of the present invention tests the components 106 and provides enhanced analysis and test results. For example, the enhanced analysis may identify incorrect, questionable, or unusual results. The test system 100 may also analyze multiple sets of data, such as data taken from multiple wafers and/or lots of wafers, to generate composite data based on multiple datasets. The operator, such as the product engineer, test engineer, manufacturing engineer, device engineer, or other personnel using the test data and analyses, may then use the results to verify and/or improve the test system 100 and/or the fabrication system and classify the components 106.

The test system 100 commences a test run, for example in conjunction with a conventional series of tests, in accordance with a test program. The tester 102 suitably executes the test program to apply signals to the components 106 and read output test data from the components 106. The tester 102 may perform multiple tests on each component 106 on a wafer or the wafer itself, and each test may be repeated several times on the same component 106. The tests may comprise any appropriate tests, such as (but not limited to) continuity, supply current, leakage current, parametric static, parametric dynamic, and functional and stress tests. Test data from the tester 102 is stored for quick access and supplemental analysis as the test data is acquired. The data may also be stored in a long-term memory for subsequent analysis and use.

Figure 2:
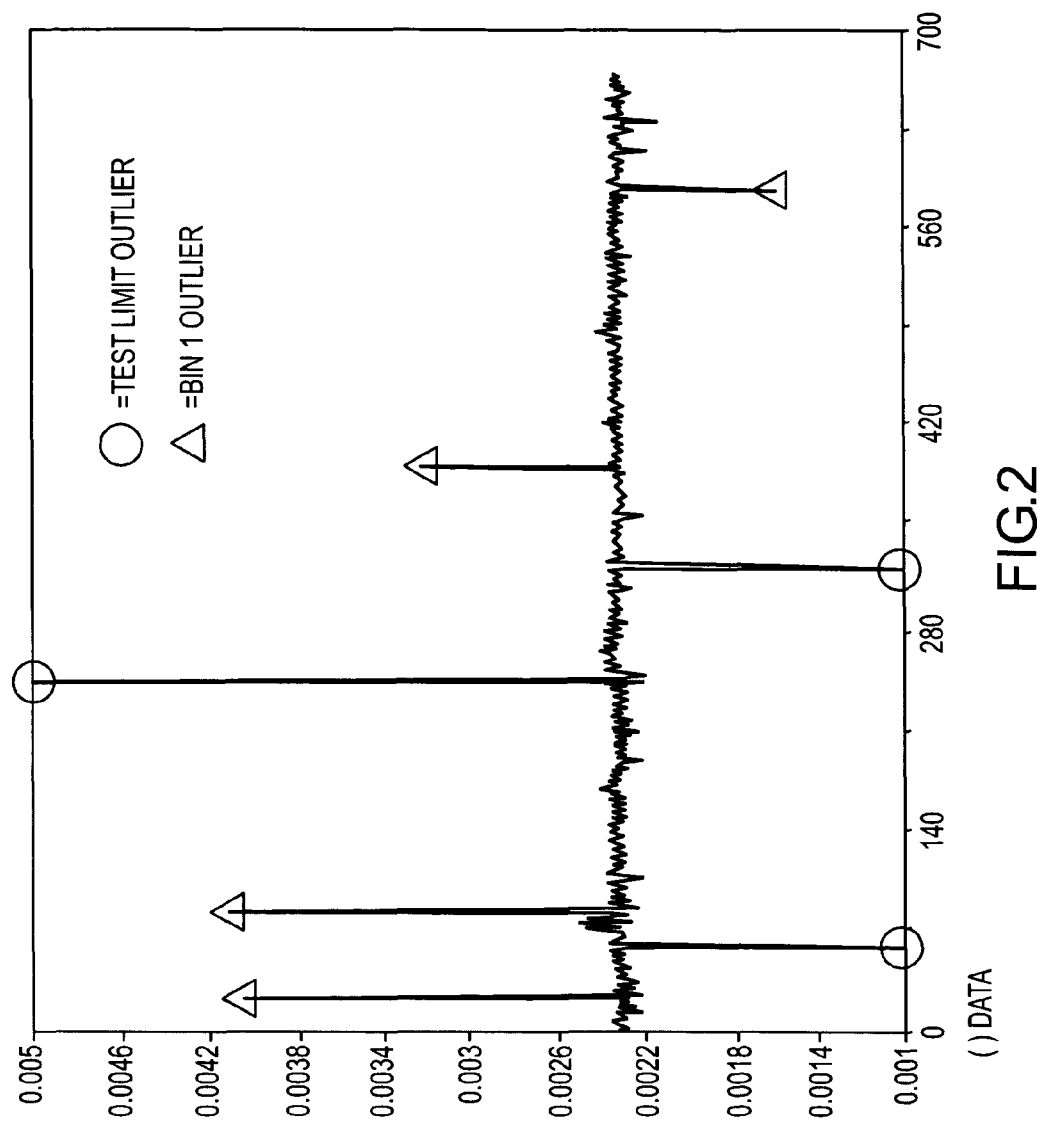
FIG. 2 is a plot of test data for a test of multiple components.

Each test generates at least one result for at least one of the components. Referring to FIG. 2, an exemplary set of test results for a single test of multiple components comprises a first set of test results having statistically similar values and a second set of test results characterized by values that stray from the first set. Each test result may be compared to an upper test limit and a lower test limit. If a particular result for a component exceeds either limit, the component may be classified as a "bad part" or otherwise classified according to the test and/or the test result.

Some of the test results in the second set that stray from the first set may exceed the control limits, while others do not. For the present purposes, those test results that stray from the first set but do not exceed the control limits or otherwise fail to be detected are referred to as "outliers". The outliers in the test results may be identified and analyzed for any appropriate purpose, such as to identify potentially unreliable components. The outliers may also be used to identify various potential problems and/or improvements in the test and manufacturing processes.

As the tester 102 generates the test results, the output test data for each component, test, and repetition is stored by the tester 102 in a tester data file. The output test data received from each component 106 is analyzed by the tester 102 to classify the performance of the component 106, such as into a particular bin classification, for example by comparison to the upper and lower test limits, and the results of the classification are also stored in the tester data file. The tester data file may include additional information as well, such as logistics data and test program identification data. The tester data file is then provided to the computer 108 in an output file, such as a standard tester data format (STDF) file, and stored in memory. The tester data file may also be stored in the storage system for longer term storage for later analysis.

When the computer 108 receives the tester data file, it analyzes the data to provide enhanced output results. The computer 108 may provide any appropriate analysis of the tester data to achieve any suitable objective. For example, the computer 108 may implement a statistical engine for analyzing the output test data, at run time or later, and identifying data and characteristics of the data of interest. The data and characteristics identified may be stored, while data that is not identified may be retained, discarded, or otherwise disposed.

The computer 108 may perform additional analysis functions upon the generated statistics and the output test data, such as automatically identifying and classifying outliers. Analyzing each relevant datum according to one or more selected algorithms suitably identifies the outliers. If a particular algorithm is inappropriate for a set of data, the computer 108 may be configured to automatically select a different algorithm.

The computer 108 may operate in any suitable manner to designate outliers, such as by comparison to pre-selected or dynamic values. For example, an outlier identification system according to various aspects of the present invention initially automatically calibrates its sensitivity to outliers based on selected statistical relationships for each relevant datum or other data. Some of these statistical relationships are then compared to a threshold or other reference point, such as the data mode, mean, or median, or combinations thereof, to define relative outlier threshold limits. In the present embodiment, the statistical relationships are scaled, for example by one, two, three, and six standard deviations of the data, to define the different outlier amplitudes. The output test data may then be compared to the outlier threshold limits to identify and classify the output test data as outliers.

The computer 108 stores the resulting statistics and outliers in memory and identifiers, such as the x-y wafer map coordinates, associated with any such statistics and outliers. Selected statistics, outliers, and/or failures may also trigger notification events, such as sending an electronic message to an operator, triggering a light tower, stopping the tester 102, or notifying a server.

In the present embodiment, the computer 108 includes a scaling element 110 and an outlier classification engine 112. The scaling element 110 is configured to dynamically scale selected coefficients and other values according to the output test data. The outlier classification engine 112 is configured to identify and/or classify the various outliers in the data according to selected algorithms.

More particularly, the scaling element 110 of the present embodiment suitably uses various statistical relationships for dynamically scaling outlier sensitivity. The scaling coefficients are suitably calculated by the scaling element and used to modify selected outlier sensitivity values. Any appropriate criteria, such as suitable statistical relationships, may be used for scaling.

The outlier classification engine 112 is suitably configured to identify and/or classify the outliers in the components 106, output test data, and/or analysis results according to any suitable algorithms. In addition, the outlier classification engine 112 may be configured to utilize multiple candidate outlier identification algorithms and identify one or more algorithms suited for identifying outliers in the output test data. Different tests generate different population distributions, such that an outlier identification algorithm that is appropriate for one test may be inappropriate for another. The outlier classification engine 112 is suitably configured to differentiate between different data populations and automatically select one or more outlier identification algorithms based on the data population type of the current data. The automatic selection may select from any appropriate set of candidate outlier identification algorithms, and may perform the selection according to any suitable criteria and analysis.

Figure 3:
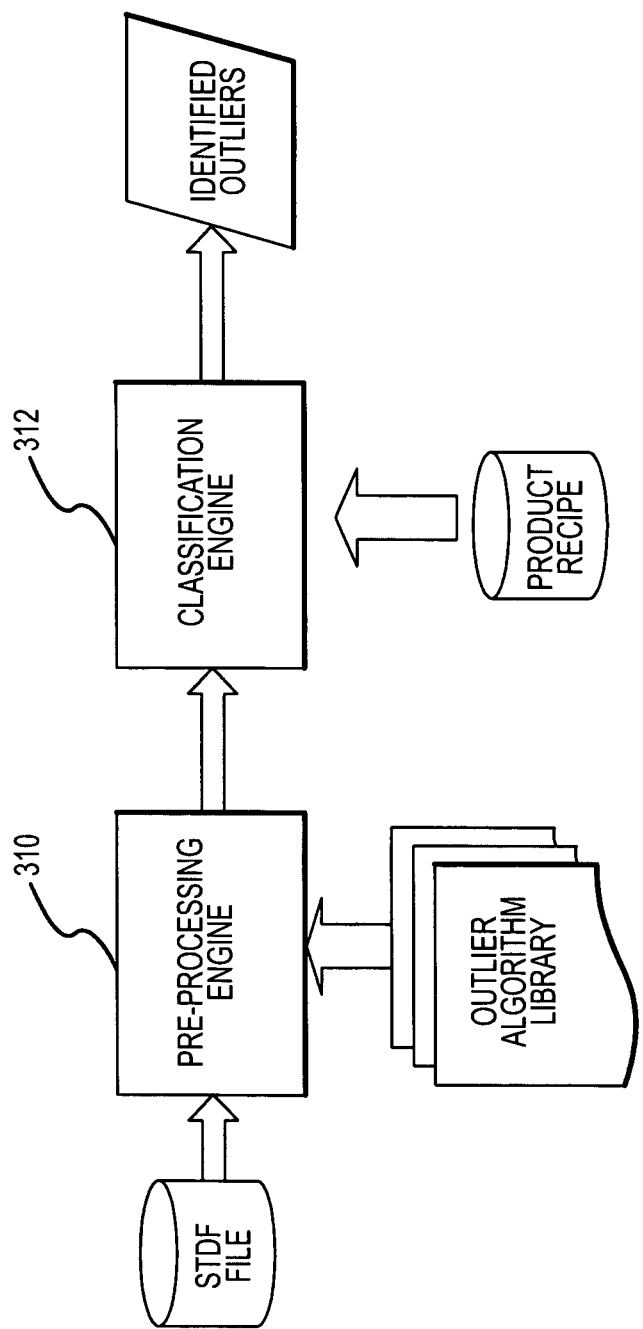
FIG. 3 is a diagram of a system for automatically selecting one or more outlier identification algorithms.

For example, referring to FIG. 3, the outlier classification engine 112 may be configured to automatically perform an outlier identification algorithm selection process. The outlier classification engine 112 suitably comprises a pre-processing engine 310 and a classification engine 312. The pre-processing engine 310 suitably generates data to facilitate selection of the relevant outlier identification algorithms. The classification engine 312 suitably selects one or more relevant outlier identification algorithms and identifies the outliers accordingly.

The output test data, for example data taken from a particular test, are initially provided to the outlier classification engine 112 to analyze the output test data for compatibility with various candidate outlier identification algorithms. The data may be analyzed in any suitable manner to identify appropriate algorithms for identifying the outliers in the output test data. For example, in the present embodiment, the pre-processing engine 310 receives the output test data and prepares the available outlier identification algorithms, such as by retrieving them from an outlier identification algorithm library stored in memory. The pre-processing engine 310 analyzes the output test data for outliers using several of the available algorithms. In the present embodiment, the pre-processing engine 310 analyzes the output test data using each of the algorithms designated by the user, or another suitable selection of algorithms, to generate pre-processing data, such as outliers as identified by all algorithms and various descriptive statistics, such as minimum, maximum, mean, median, standard deviation, CPK, CPM, and the like.

The algorithms may be based on industry standard (e.g., IQR, median +/−N*sigma, etc.) and/or proprietary, custom, or user-defined outlier identification techniques. The outlier identification algorithm library is suitably configurable by the user, for example to add, remove, or edit outlier identification algorithms, for example according to the particular products under test or the characteristics of the tests to be performed. Different algorithms may be appropriate for different statistical population types, such as normal, logarithmic normal, bimodal, clamped, or low CPK data populations. The candidate outlier identification algorithms may comprise any suitable algorithms for various types and distributions of data, such as inter-quartile range (IQR) normal distribution, 3 sigma; IQR normal distribution, 6 sigma; IQR log normal, 3 sigma; IQR log normal, 6 sigma; bimodal algorithms; clamped algorithms; low capability algorithms; custom algorithms based on 3-, 6-, or n-sigma; and proprietary algorithms having various sensitivities. The pre-processing engine 310 may also analyze the test data to generate characteristics relating to the output test data. For example, the pre-processing engine 310 may calculate various statistical properties of the output test data.

The pre-processing algorithm results are suitably dynamically selected for outlier detection. In the present embodiment, the outlier classification engine 112 analyzes the test results to identify the most useful or applicable outlier identification algorithms. The data from the selected outlier identification algorithms may be retained, while the remaining data is discarded. For example, in the present embodiment, the classification engine 312 receives the results of the pre-processing analysis generated by each of the available outlier identification algorithms. The classification engine 312 analyzes the pre-processing data according to any suitable criteria, such as predetermined and/or user-defined recipe-driven rules to determine whether the pre-processing data satisfy various criteria.

The rules may be any appropriate rules, for example employing statistical ratios or values, such as comparing statistics, like minimum, maximum, mean, median, standard deviation, CPK, and CPM, to various thresholds or other criteria. For example, the classification engine 312 may skip the outlier detection process under certain circumstances, such as having too few test results or a too narrow or a bimodal distribution among the test results. The rules may be pre-selected and/or may be adjusted or added by the user to accommodate specific conditions of the products and test environment. Further, the classification engine 312 may be configured to apply a particular algorithm to a certain type of test, for example when the results of the test are known to have a particular distribution. Other rules may determine whether a particular test is applicable. For example, the classification engine 312 may compare the CPK to a threshold. If the CPK is below the threshold, then the IQR normal outlier identification algorithm may be used. In the present system, results from an algorithm satisfying a rule are used for outlier identification. Other algorithm results for that test are suitably ignored.

The outlier classification engine 112 may also identify and classify selected outliers and components 106 according to the output test results and the information generated by the computer 108. For example, the outlier classification engine 112 is suitably configured to classify the components 106 into critical/marginal/good part categories, for example in conjunction with user-defined criteria; user-defined good/bad spatial patterns recognition; classification of pertinent data for tester data compression; test setup in-situ sensitivity qualifications and analysis; tester yield leveling analysis; dynamic wafer map and/or test strip mapping for part dispositions and dynamic retest; or test program optimization analyses. The outlier classification engine 112 may classify data in accordance with conventional SPC control rules, such as Western Electric rules or Nelson rules, to characterize the data.

The outlier classification engine 112 suitably classifies the data using a selected set of classification limit calculation methods. Any appropriate classification methods may be used to characterize the data according to the needs of the operator. The present outlier classification engine 112, for example, classifies outliers by comparing the output test data to selected thresholds, such as values corresponding to one, two, three, and six statistically scaled standard deviations from a threshold, such as the data mean, mode, and/or median. The identification of outliers in this manner tends to normalize any identified outliers for any test regardless of datum amplitude and relative noise.

The outlier classification engine 112 analyzes and correlates the normalized outliers and/or the raw data points based on user-defined rules. The outlier classification engine 112 suitably performs the classification according to each test, which may be performed independently of data from other tests or in conjunction with such data from other tests. Any suitable criteria may be used for classifying the components based on test failures and outliers, such as:

FAIL if the part fails at least on one test.

CRITICAL if at least one test has been identified to have a LARGE outlier or at least two MEDIUM outliers on two different tests for the otherwise passing part.

MARGINAL if at least one test has been identified to have a MEDIUM outlier or at least four SMALL outliers on four different tests for the otherwise passing part.

SMALL if at least one test has been identified to have a SMALL outlier for the otherwise passing part.

PASS without any SMALL, MEDIUM, or LARGE outlier for the otherwise passing part.

Criteria for small, medium, and large outliers may be selected according to any suitable criteria, such as thresholds based on the test limits and/or characteristics of the data.

Figure 4:
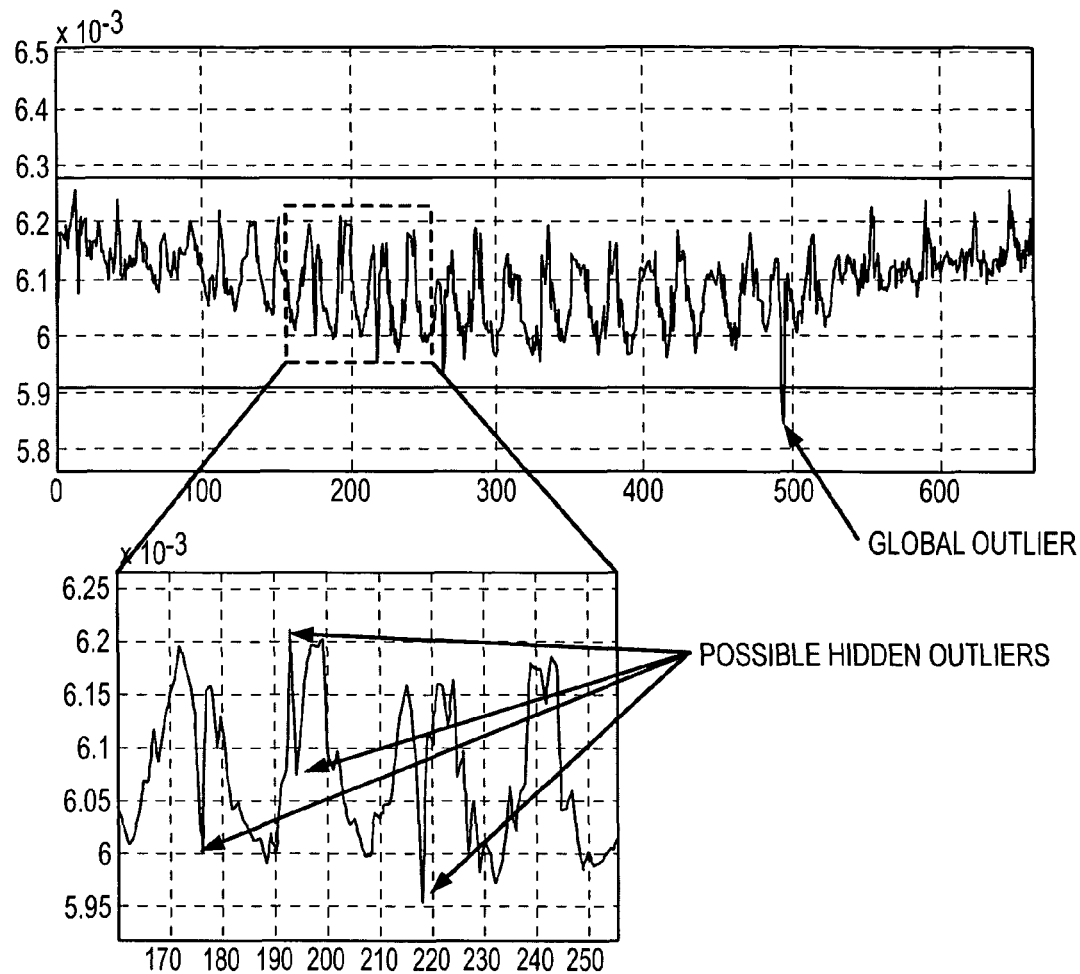
FIG. 4 is a plot of test data having global outliers and local outliers.

The outlier classification engine 112 may also be configured to identify local or "hidden" outliers in the data, which are inconsistent data points within a local group of data, but do not cross the thresholds defining the "global" outlier boundaries of the main population. Referring to FIG. 4, a global outlier lies outside the data distribution of the main data population. Local outliers, however, do not lie outside the data distribution of the main data population, but may deviate significantly from a smaller local population of data points, such as a temporally or spatially local population.

Figure 5:
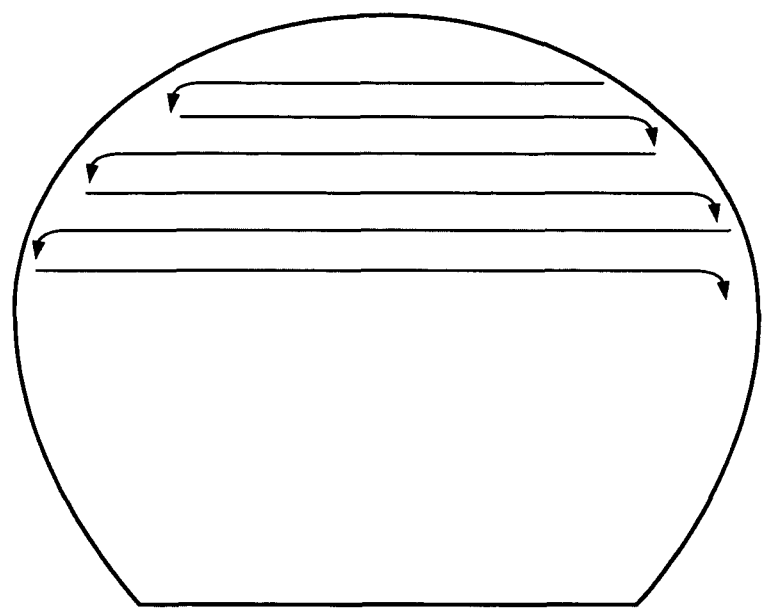
FIG. 5 is a diagram of a wafer and a sample path followed by a test prober over the wafer.
Figure 6:
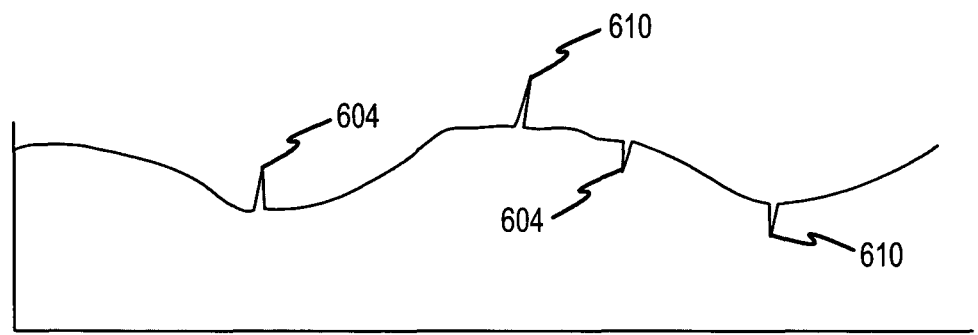
FIG. 6 is a diagram of variations of test data as the prober follows the path.

For example, referring to FIG. 5, the tester generates data by testing various components on the wafer sequentially. The tester moves the prober from component to component, accumulating test data for each component. Due to variations in the manufacturing process and materials and the testing process, the test data may vary regularly as the prober traverses the wafer (FIG. 6). Data points 610 lying well outside the variations are ordinarily classified as global outliers. Data points 604 within or slightly beyond the variations ordinarily escape classification as a global outlier, even if the data points 604 significantly differ from the data points for spatially nearby or corresponding components.

The outlier classification engine 112 may be configured to identify such local outliers 604 according to any suitable mechanism or process. The data may be analyzed as the data is generated or after the analysis is completed and the data stored. Further, the data may be pre-processed, such as by removing global outliers and/or data for components classified as failures, or normalizing data across various sections of the wafer, such as the sections shown in FIG. 25. In addition, the data may be normalized to address differences in data that may be generated due to known causes. For example, if the test data was generated using multi-site testing in which multiple resources test wafers or components simultaneously, variations in the data may be induced due to disparities in the resources. For multi-site testing, the data may be analyzed for local outliers for all of the site, for each site independently, and/or for all normalized sites. The test data may comprise any type of test data, such as bin results or parametric testing data. In the present embodiment, the local outliers 604 are identified at run time, and the outlier classification engine 112 is integrated into the test program executed by the tester 102.

In one embodiment, as parametric data is processed, the outlier classification engine 112 may calculate local outlier thresholds for a local data set, such as a selected number of most recently generated data. The data to be analyzed may comprise any suitable data, such as preceding data points, subsequent data points, both preceding and subsequent data points, temporally related data points, or spatially related data points. In addition, the number of data points in the local data set may be selected according to any suitable criteria, such as using a pre-selected number of data points or selecting the number of data points according to various criteria, such as the variability or noisiness of the data. If the data is noisy, the number of data points may be automatically adjusted, for example by increasing the number of data points in the local data set to reduce the effects of the noise. The local outlier thresholds may be dynamically re-calculated with accumulation of new parametric data, for example by using a first-in, first-out (FIFO) calculation. The parametric data for the components in the area may then be compared to the thresholds to identify local outliers.

Figure 7A:
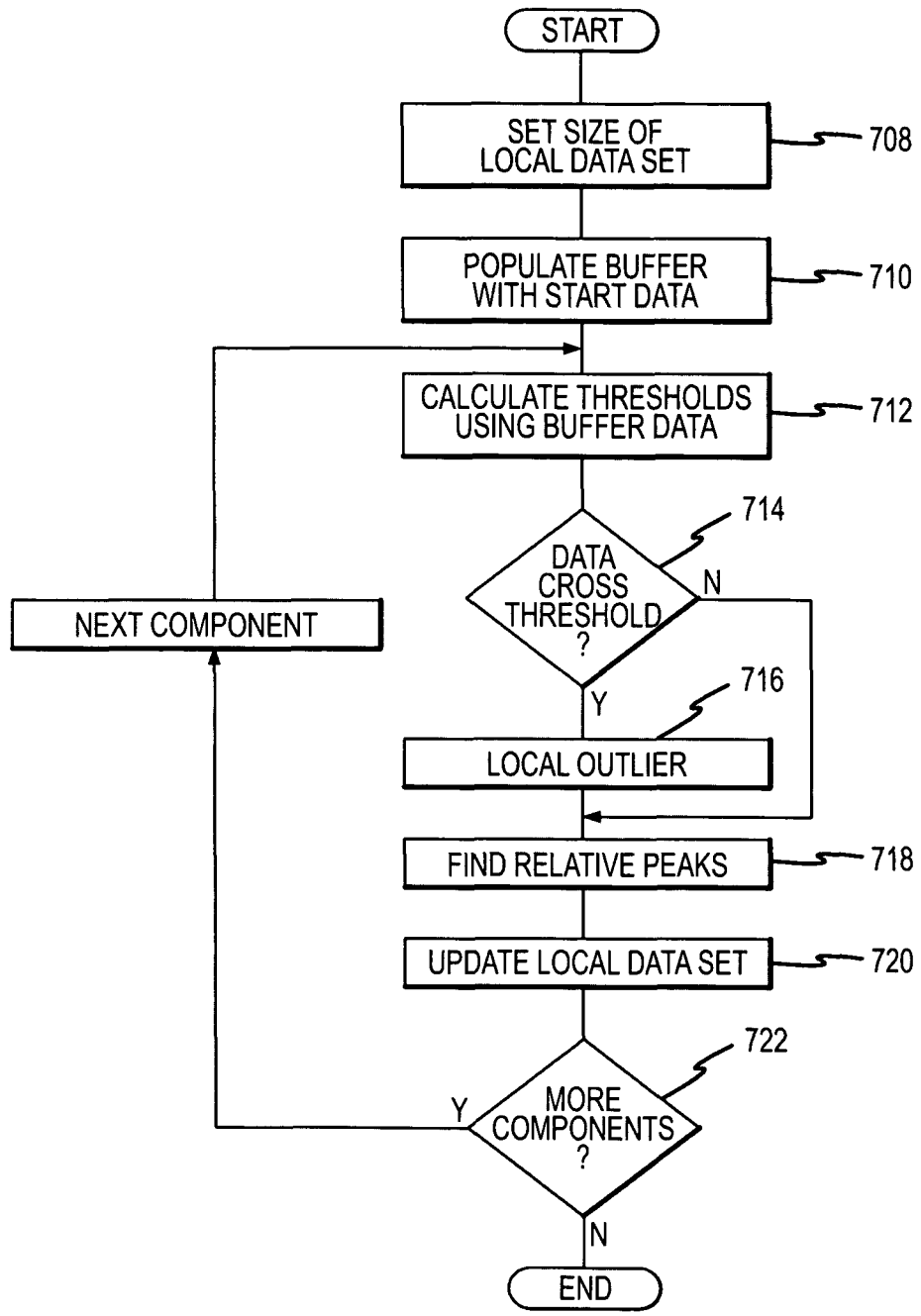
FIG. 7A and 7B are flow diagrams for identifying local outliers based on most recent test data.
Figure 7B:
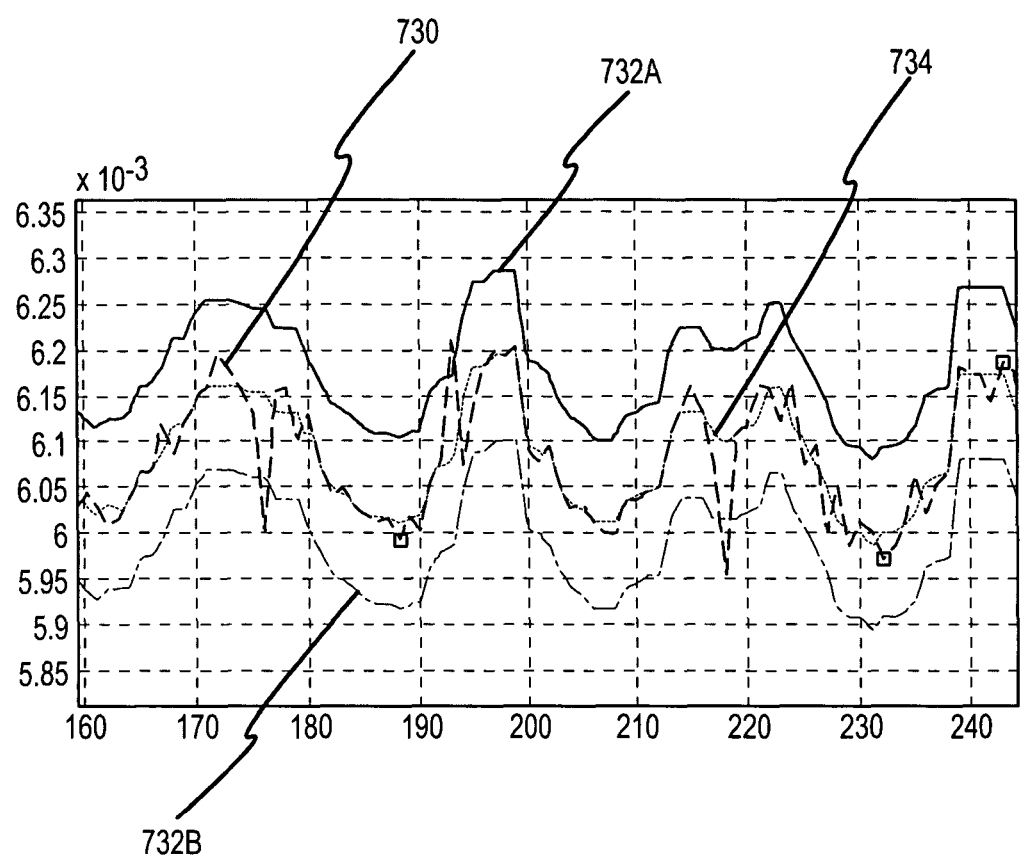

For example, referring to FIGS. 7A-B, the outlier classification engine 112 sets the size of the local data set (708), such as by retrieving a pre-selected size from memory, requesting a selection from the operator, or calculating an appropriate size according to a suitable algorithm, such as according to the type of data, components, or noisiness of the data. After selecting the size, the outlier classification engine 112 populates the data set with data 730. The test data 730 may be stored in a buffer, such as a FIFO register. Empty locations in the buffer, such as empty data points corresponding to nonexistent data, failures, or global outliers, may be ignored or populated with initial data (710), such as preselected data, idealized data, or average data for the remaining data in the buffer.

The data 730 in the buffer are then used to calculate upper and lower local outlier thresholds 732A, B (712). The upper and lower local outlier thresholds 732A, B may be calculated using any suitable technique, such as calculating standard deviations from the average of the preceding component values, ranges of component values, or other appropriate method. For example, the outlier classification engine 112 may calculate a smoothed value 734 or a statistical value based on multiple points in the local data set, such as a mean, median, or mode for the local data set. In the present embodiment, the upper and lower local outlier thresholds are calculated according to the following equations:

UpperThreshold=smooth_data+threshold*$IQR_{data}$
LowerThreshold=smooth_data−threshold*$IQR_{data}$ where UpperThreshold is the upper local outlier thresholds, LowerThreshold is the lower local outlier thresholds, smooth_data is the value based on multiple points in the local data set (in the present embodiment the median value), threshold is a constant, such as a user-selected constant, and $IQR_{data}$ is the inter-quartile range of the data in the local data set. The threshold value may have any suitable value, for example between about 1.5 and 3.0.

The test data for the current component is then compared to the upper and lower local outlier thresholds (714). If the current data exceeds either threshold, the component is designated as a local outlier (716). The locations of the local outliers are stored for reporting or other use. The local outliers may also be further processed, such as for classification based on magnitude or other suitable processing.

The local data set may also be processed for any other suitable information. For example, the outlier classification engine 112 may analyze the data to identify relative maxima and minima, such as within the overall data set or smaller portions of the data set (718). In various situations, the relative maxima and minima may not be suitable candidates for classification as local outliers. Consequently, the outlier classification engine 112 may be configured to identify the relative maxima and minima and rule them as ineligible for designation as local outliers.

The outlier classification engine 112 may identify the relative maxima and minima in any suitable manner. For example, in the present embodiment, the outlier classification engine 112 selects a portion of the data set, such as a set that is smaller or larger than the local data set, such as one quarter or one fifth of the local data set nearest the current data point, or the entire data set. The data in the selected portion of the local data set is then analyzed for maxima and minima, for example by searching for the highest and lowest values in the portion of the data set and/or a slope in the smoothed data changing between positive and negative.

The buffer contents are then updated to add the test value for a new component and remove the oldest test data (720). The process repeats until all of the data in the data set, such as the data for all components on the wafer, have been processed (722).

In an alternative embodiment, local outliers may be identified using a proximity analysis. The proximity analysis identifies local outliers by comparing parametric or other data for individual components to local outlier thresholds calculated using data for spatially related components. The proximity analysis may also be weighted, for example according to the distance between a central component and a nearby component. Proximity analysis may be performed by any appropriate system, such as a dedicated proximity analysis engine or a proximity analysis engine associated with another task, like a proximity analysis engine used for generating composite masks based on multiple datasets as described below.

Figure 26:
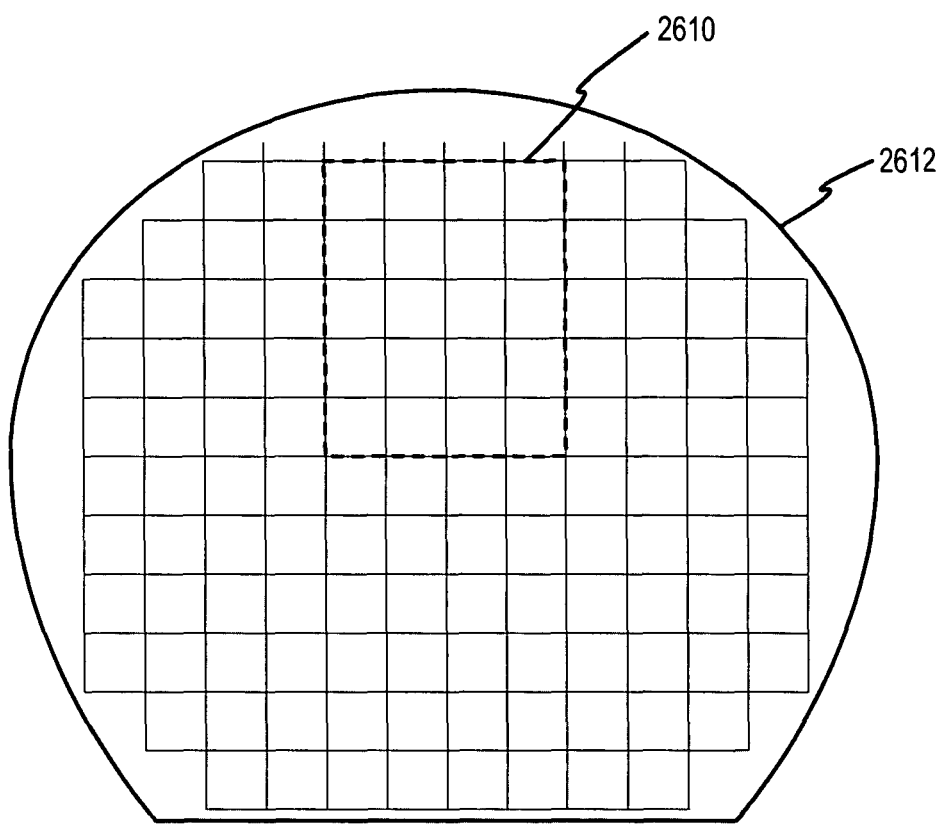
FIG. 26 is a diagram of a wafer and a spatial analysis window.
Figure 27:
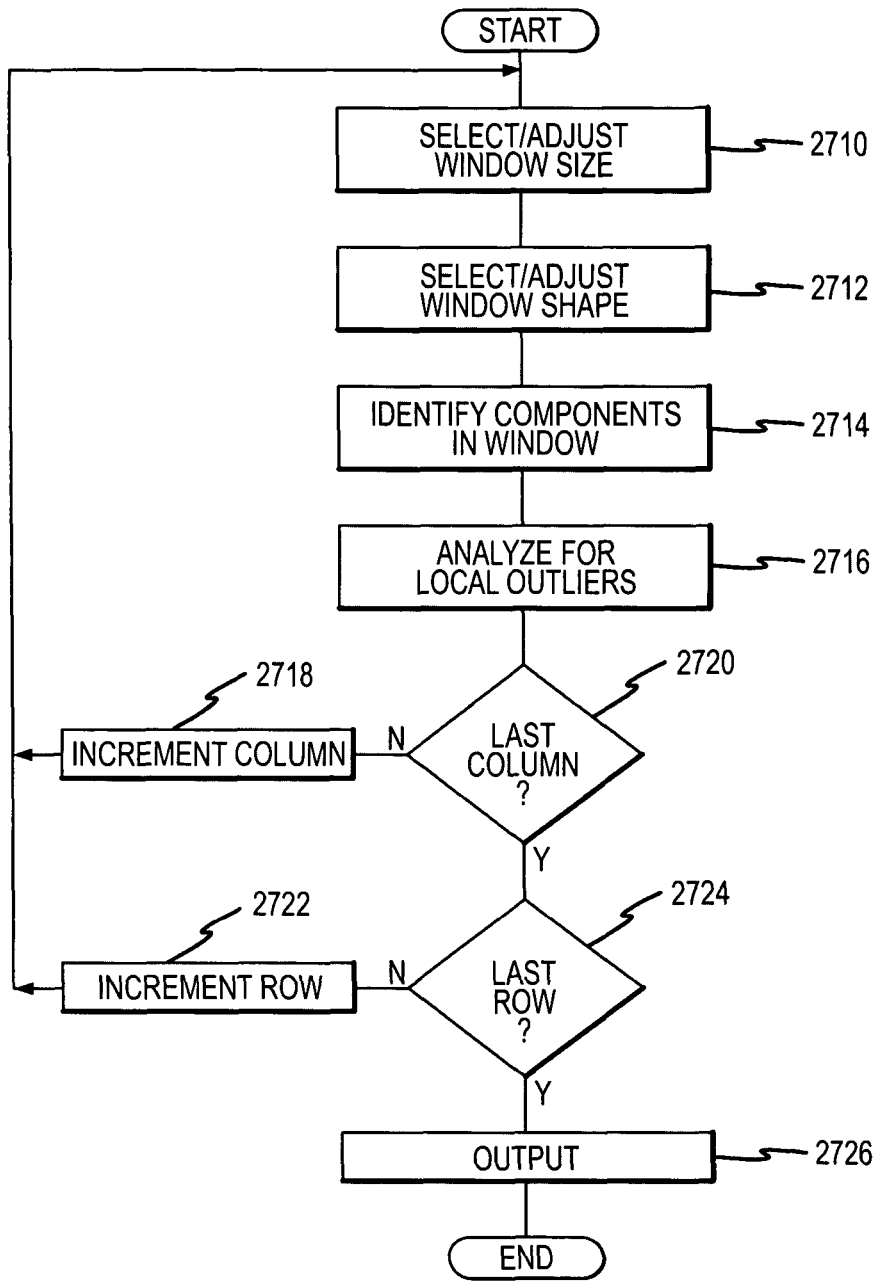
FIG. 27 is a flow diagram of a spatial analysis process.

For example, the computer 108 may be configured to identify local outliers by identifying outliers within subsets of the overall dataset, such as within data for a selected group of components on a particular wafer. In one embodiment, referring to FIGS. 26 and 27, the computer 108 may establish a window 2610 of a selected size that may be used to select multiple components on a wafer 2612. The window 2610 comprises a perimeter defining a spatial area of interest, such as a subset of the components on the wafer 2612. The size of the window 2610 may be selected or adjusted according to any suitable criteria, such as the type of test or component or the desired sensitivity of the outlier analysis (2710). The shape of the window may likewise be selected according to any appropriate criteria, such as the spatial area of interest (2712). For example, if the area of interest does not facilitate the use of a rectangular window, such as near the curved edges of the wafer 2612, an alternative shape may be selected for the window 2610 to accommodate the relevant area of the wafer 2612.

The window 2610 is then applied to various areas of the wafer 2612 (2714), and local outliers are identified among the data for components within the window 2610. For example, the window 2610 may be initially applied to a start area, such as the upper left section of the wafer 2612. Because the upper left area of the wafer does not exhibit a rectangular array of components, an alternative window shape may be used to select a set of components. Data for the components within the window are then retrieved from memory and analyzed for outliers, for example using only the data for components within the window (2716). In the present embodiment, the data for the components has already been processed to remove selected data, such as global outliers and failures that have already been identified. Any suitable outlier detection system or approach may be used to identify the local outliers. Locations of identified local outliers are stored, along with any other relevant information.

After identification of the local outliers, the window may be moved to a next location. For example, the window may be moved laterally one column to the right (2718). The local outlier identification process is then repeated for the components within the window at the new location. This process repeats as until the window reaches the right side of the wafer (2720). The window may then be moved down by one row (2722), and the process repeats. This process may be repeated until the window has been applied to the entire wafer (2724). Upon completion, information relating to the identified local outliers may be provided as output or further analyzed, for example for further classification (2726).

Figure 8:
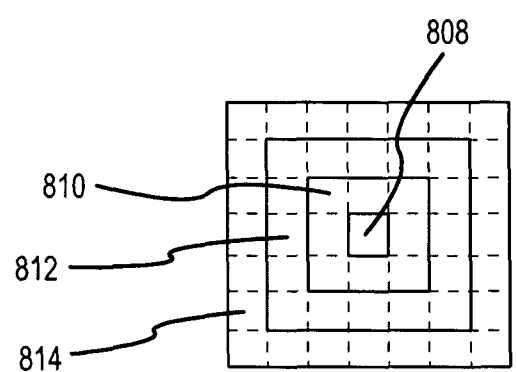
FIG. 8 is a diagram of a central component on a wafer and surrounding bands of components.
Figure 9:
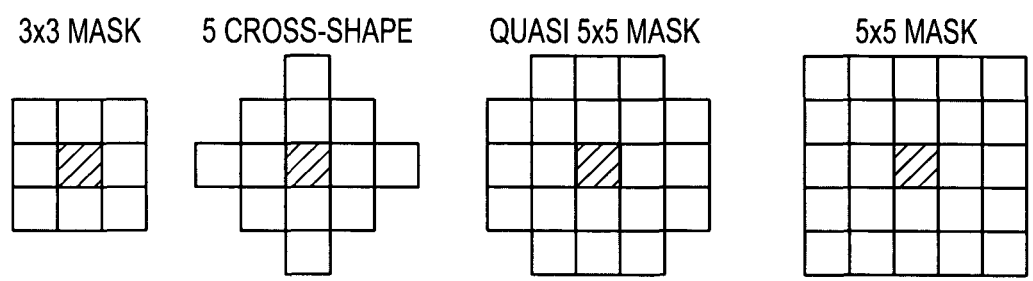
FIG. 9 is a diagram of potential filter types for proximity analysis.

In an alternative or supplementary embodiment, the computer 108 may perform a proximity analysis for each component on the wafer. Referring to FIG. 8, for each component on the wafer, the proximity analysis system may analyze data associated with surrounding components. The number of components or distance from the central component 808 may be selected according to any suitable criteria. Similarly, the type of pattern may also be selected (see FIG. 9), either according to a pre-selected type, an operator designation, or an automatic selection process, for example according to the area around the central component (e.g., edge, empty spaces, or possible sampling). In the present embodiment, the system selects a pattern having at least eight components.

The present embodiment analyzes consecutive surrounding bands 810, 812, 814 of components. The number of bands of components may be any appropriate number, such as between one to ten bands. Data for components in the first band 810 are analyzed to establish a high and a low threshold according to any suitable criteria or technique. High and low thresholds are similarly determined for any additional bands. Thresholds derived from bands 812, 814 that are farther from the central component may be assigned lower weights, and the thresholds may then be combined to generate local outlier thresholds. The datum for the central component 808 is then compared to the local outlier thresholds to determine whether the datum is a local outlier.

Figure 10:
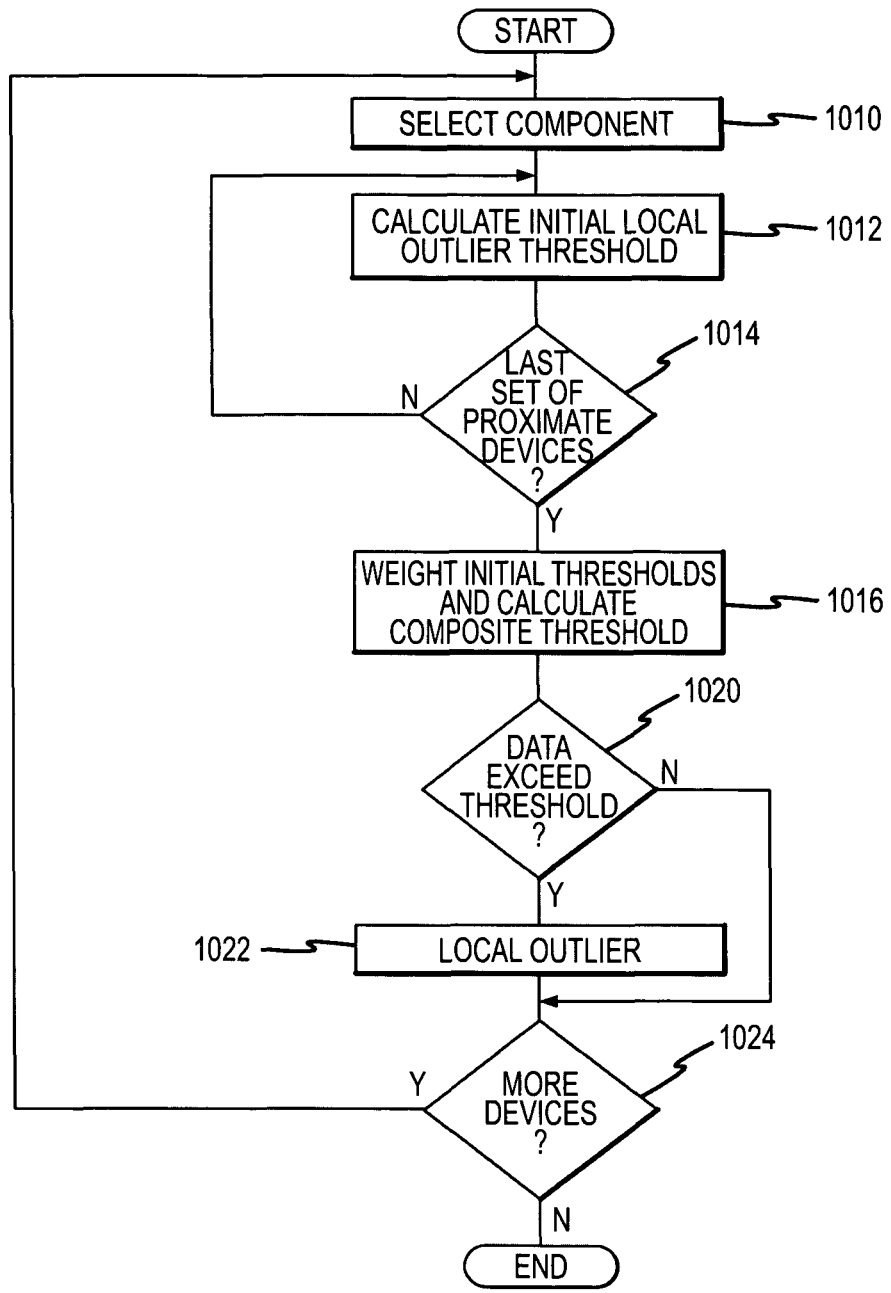
FIG. 10 is a flow diagram for identifying local outliers using proximity analysis

More particularly, referring to FIG. 10, a process for identifying local outliers begins by selecting a component for analysis and identifying the surrounding components (1010). The test data for the surrounding components may then be designated to calculate the local outlier thresholds. In the present system, the test data for the first band of components, comprising eight components, are used to calculate the local outlier thresholds (1012). Local outlier thresholds are also calculated for the remaining bands of components 812, 814 (1014). Outlier thresholds may be calculated in any suitable manner, such as according to the average test values and standard deviations from the average for each band of components.

In some cases, the surrounding bands 810, 812, 814 may not include complete data sets. For example, components near the edge of the wafer may not have components in locations that make up the surrounding bands. Similarly, if the data set has been processed to remove data for components that have already been classified as failures or outliers, the surrounding bands lack data for those components. In one embodiment, the missing data is ignored, and the process continues using the data that is available. In other embodiments, the data is replaced with substitute data. For example, the missing data may be replaced with idealized data representing ideal values for such components, or with data based on other components on the wafer, such as components in surrounding bands around the missing data or components in corresponding positions on other wafers in the lot.

When each band of components has been analyzed to generate local outlier thresholds, combined local outlier thresholds may be calculated based on the initial local outlier thresholds calculated for each band (1016). The combined local outlier thresholds may be calculated in any suitable manner. In the present embodiment, the outlier classification engine 112 assigns weights to each of the initial thresholds according to the distance of the corresponding band from the central component 808. Thus, initial outlier thresholds for the first band 810 may be accorded greater weight than the thresholds for the second band 812, and the thresholds for the second band may be accorded more weight than those of the third band 814.

Upon calculation of the combined local outlier thresholds, the test datum for the central component is compared to the combined thresholds (1020). If the datum exceeds a combined threshold, the relevant datum is designated as a local outlier (1022). The process may be repeated for each datum in the data set (1024). In addition, local outliers may be classified, such as according to the magnitude of their difference from the proximate test results. For example, in the present embodiment, outliers are classified as small, medium, or large. The distinctions between each classification may be selected using any suitable criteria, such as a number of standard deviations from the threshold.

In another embodiment, the outlier classification engine 112 may initially assess whether to perform local outlier detection. The outlier classification engine 112 may assess whether to perform local outlier detection according to any suitable criteria, such as according to statistical calculations relating to various portions of the data set. The outlier classification engine 112 may be configured to identify signatures, site-to-site, section-to-section and wafer-to-wafer variations.

Figure 25:
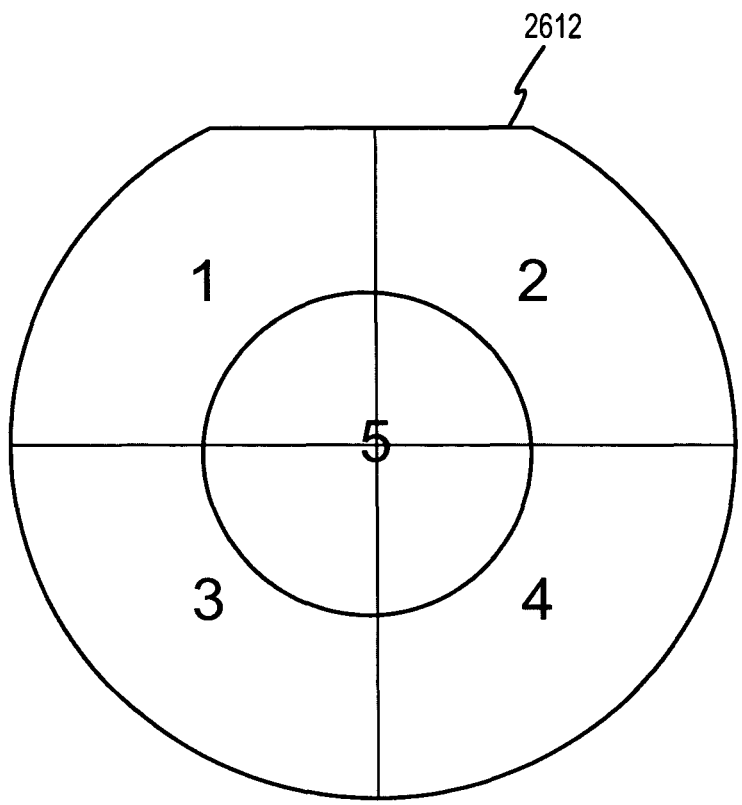
FIG. 25 is a diagram of a sectional separation of a wafer.

For example, referring to FIG. 25, the wafer 2612 may be partitioned into selected areas, such as four corner sections 1-4, a center section 5, and a whole wafer section 0. The outlier classification engine 112 may calculate various values for the various sections to identify differences, such as may be due to multi-site probing, and facilitate normalization of the data. The various values may comprise any suitable information relating to the data in the sections, such as:

site-IQR-Error="MaxRawIQR/MinRawIQR"
site-LQ-Error="RawLQ_Range/MaxRawIQR"
site-UQ-Error="RawUQ_Range/MaxRawIQR"

The values may be compared to one or more thresholds and, if one or more thresholds are exceeded, the outlier classification engine 112 may proceed with or forego local outlier detection. For example:

if the site-IQR-Error is exceeds the threshold, then the local outlier detection techniques may not be effective;

if statistics of sections 0-5 are similar, then the local outlier detection process may be omitted;

if statistics of section 1-4 are similar but differ from the statistics of sections 0 and 5, then the local outlier detection process may proceed; and if statistics of sections 1-4 vary, then the local outlier detection process may proceed.

The local outlier detection processes may be applied to the various sections, for example by using a global outlier detection process on only one section at a time.

The computer 108 may be configured to perform additional analysis of the output test data and the information generated by the computer 108. For example, the computer 108 may identify tests having high incidences of failure or outliers, such as by comparing the total or average number of failures, outliers, or outliers in a particular classification to one or more threshold values.

The computer 108 may also provide identification of critical, marginal, and good parts for global outliers and/or local outliers as defined by sensitivity parameters in a recipe configuration file. Part identification may provide disposition/classification before packaging and/or shipping the part that may represent a reliability risk, and/or test time reduction through dynamic probe mapping of bad and good parts during wafer probe. Identification of these parts may be represented and output in any appropriate manner, for example as good and bad parts on a dynamically generated prober control map (for dynamic mapping), a wafer map used for offline inking equipment, a test strip map for strip testing at final test, a results file, and/or a database results table.

Supplemental data analysis at the cell controller level tends to increase quality control at the probe, and thus final test yields. In addition, quality issues may be identified at product run time, not later. Furthermore, the supplemental data analysis and signature analysis tends to improve the quality of data provided to the downstream and offline analysis tools, as well as test engineers or other personnel, by identifying global and/or local outliers.

Figure 11A:
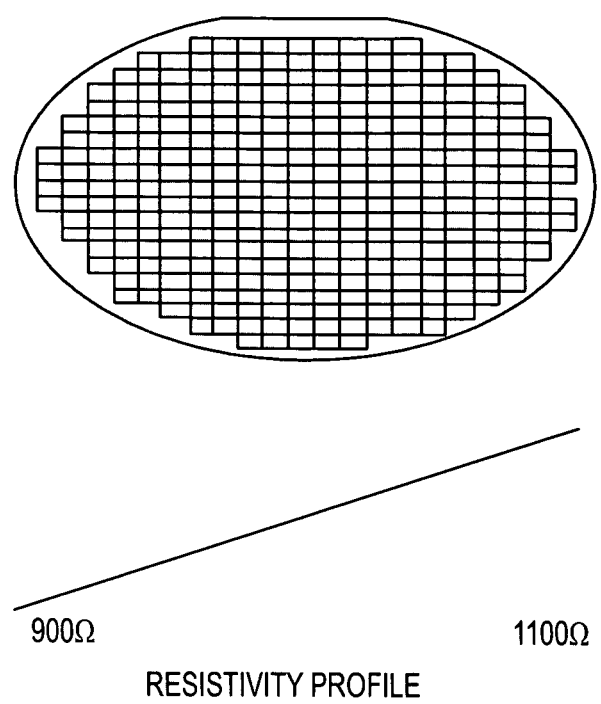
FIG. 11A is a representation of a wafer having multiple devices and a resistivity profile for the wafer.
Figure 11B:
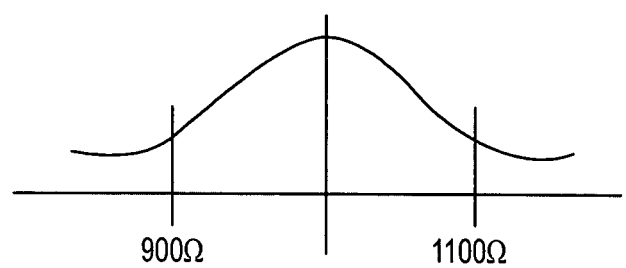
FIG. 11B is a graph of resistance values for a population of resistors in the various devices of the wafer of FIG. 11A.

Referring now to FIGS. 11A-B, an array of semiconductor devices are positioned on a wafer. In this wafer, the general resistivity of resistor components in the semiconductor devices varies across the wafer, for example due to uneven deposition of material or treatment of the wafer. The resistance of any particular component, however, may be within the control limits of the test. For example, the target resistance of a particular resistor component may be 1000 $\Omega$+/−10%. Near the ends of the wafer, the resistances of most of the resistors approach, but do not exceed, the normal distribution range of 900$\Omega$ and 1100 $\Omega$.

Components on the wafer may include defects, for example due to a contaminant or imperfection in the fabrication process. The defect may increase the resistance of resistors located near the low-resistivity edge of the wafer to 1080$\Omega$. The resistance is well over the 1000 $\Omega$ expected for a device near the middle of the wafer, but is still within the normal distribution range.

Figure 12A:
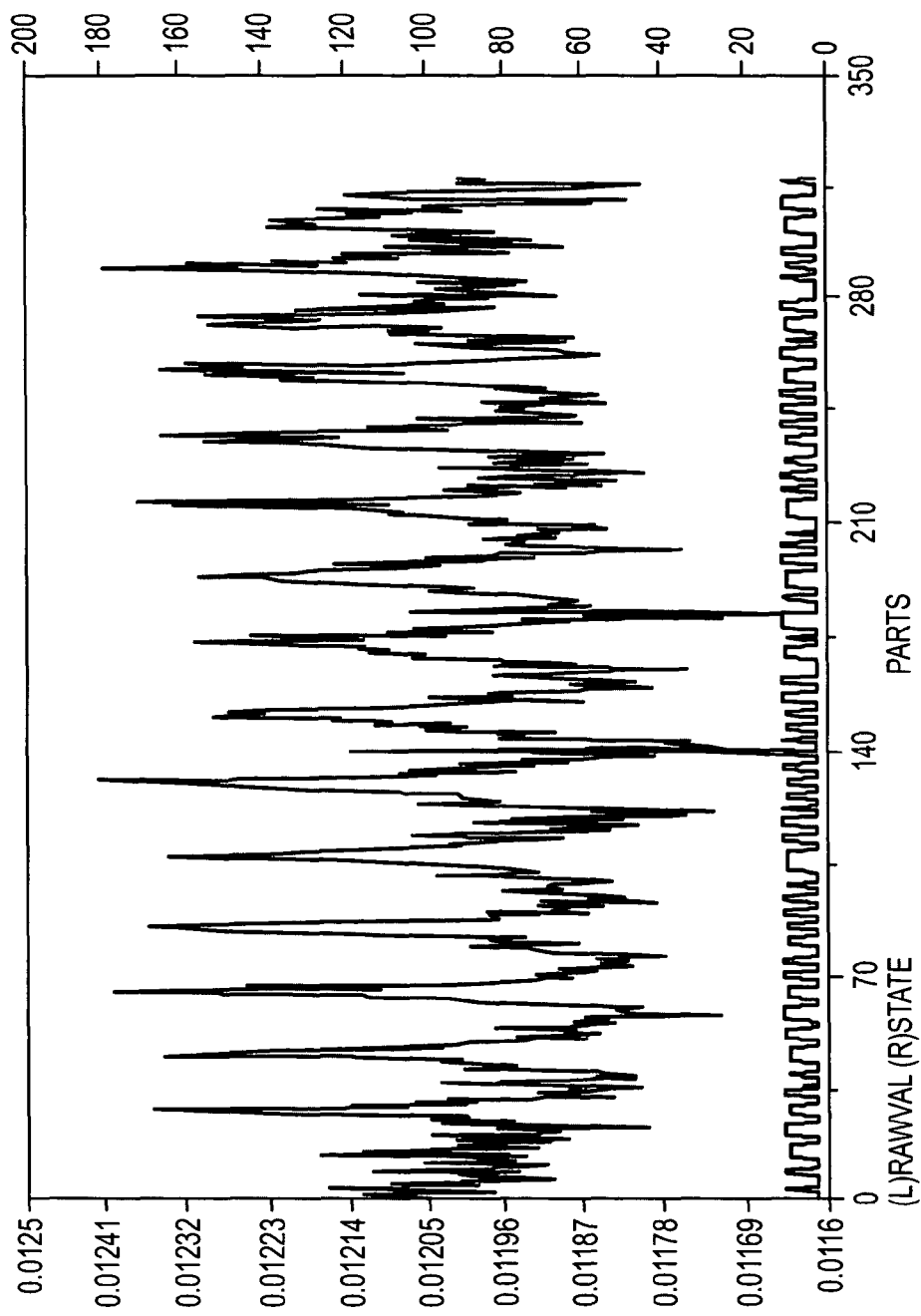
FIGS. 12A-B are general and detailed plots, respectively, of raw test data and outlier detection triggers for the various devices of FIG. 11A.
Figure 12B:
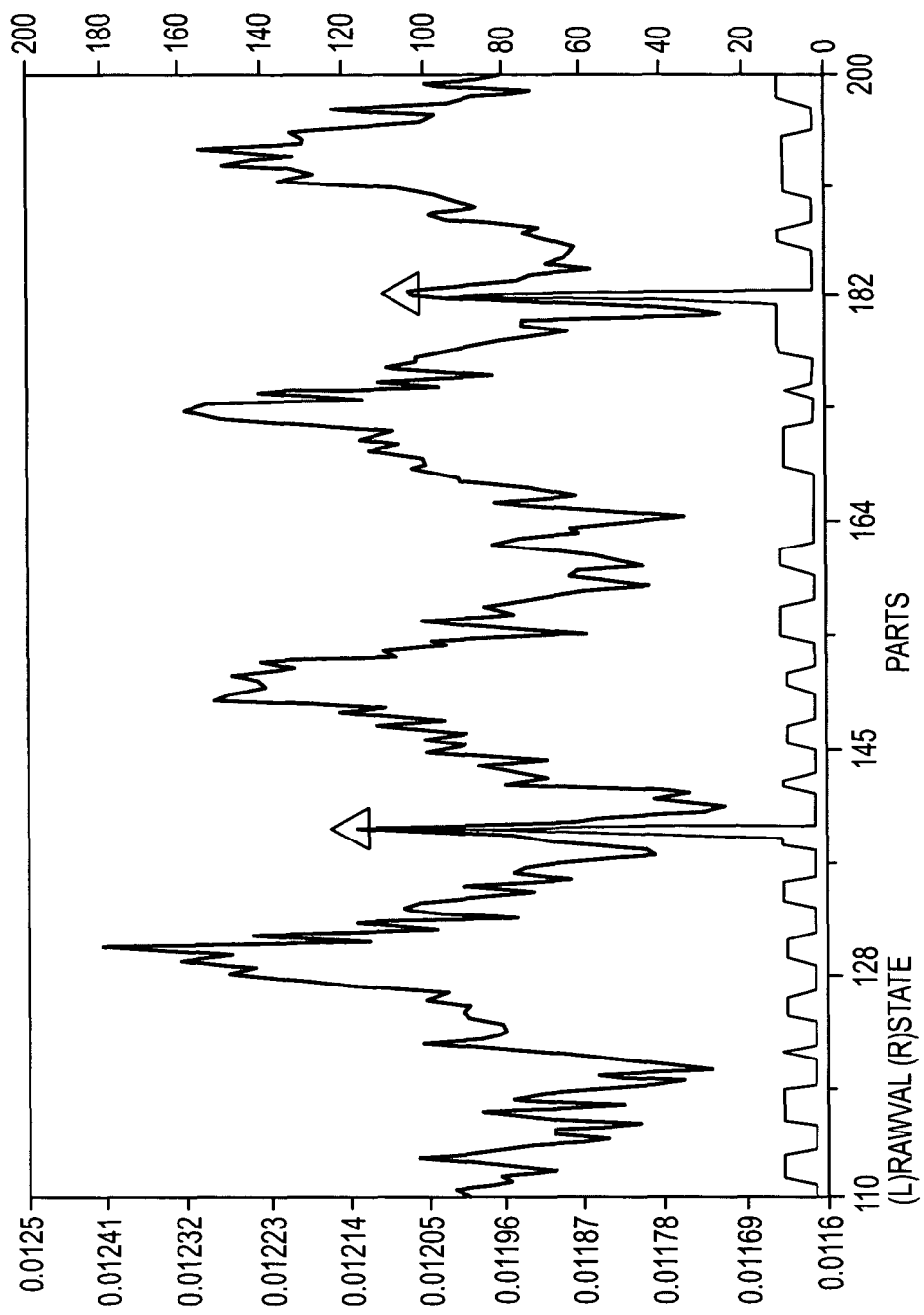

Referring to FIGS. 12A-B, the raw test data for each component may be plotted. The test data exhibits considerable variation, due in part to the varying resistivity among components on the wafer as the prober indexes across rows or columns of devices. The devices affected by the defect are not easily identifiable based on visual examination of the test data or comparison to the test limits.

When the test data is processed according to various aspects of the present invention, the devices affected by the defect may be associated with outliers in the test data. The test data is largely confined to a certain range of values. The data associated with the defects, however, is unlike the data for the surrounding components. Accordingly, the data illustrates the departure from the values associated with the surrounding devices without the defect. The outlier classification engine 112 may identify and classify the outliers according to the magnitude of the departure of the outlier data from the surrounding data.

The computer 108 collects data from the test system 100, suitably at run time, and provides an output report to a printer, database, operator interface, or other desired destination. Any form, such as graphical, numerical, textual, printed, or electronic form, may be used to present the output report for use or subsequent analysis. The computer 108 may provide any selected content, including selected output test data from the tester 102 and results of the supplementary data analysis.

In the present embodiment, the computer 108 suitably provides a selection of data from the output test data specified by the operator as well as supplemental data at product run time. The computer 108 may also be configured to include information relating to the outliers, or other information generated or identified by the supplementary data analysis element. If so configured, the identifiers, such as x-y coordinates, for each of the outliers are assembled as well. The coordinates for the operator-selected components and the outliers are merged into an output report, which in the current embodiment is in the format of the native tester data output format. Merging resulting data into the output report facilitates compression of the original data into summary statistics and critical raw data values into a smaller native tester data file, reducing data storage requirements without compromising data integrity for subsequent customer analysis.

The retrieved information is then suitably stored. The report may be prepared in any appropriate format or manner. In the present embodiment, the output report suitably includes a dynamic datalog having a wafer map indicating the selected components on the wafer and their classification. Further, the computer 108 may superimpose wafer map data corresponding to outliers on the wafer map of the preselected components. Additionally, the output element may include only the outliers from the wafer map or batch as the sampled output. The output report may also include a series of graphical representations of the data to highlight the occurrence of outliers and correlations in the data.

The output report may be provided in any suitable manner, for example output to a local workstation, sent to a server, activation of an alarm, or any other appropriate manner. In one embodiment, the output report may be provided off-line such that the output does not affect the operation of the system or transfer to the main server. In this configuration, the computer 108 copies data files, performs the analysis, and generates results, for example for demonstration or verification purposes.

In addition to the supplementary analysis of the data on each wafer, a testing system 100 according to various aspects of the present invention may also perform composite analysis of the data and generate additional data to identify patterns and trends over multiple datasets, such as using multiple wafers and/or lots. Composite analysis is suitably performed to identify selected characteristics, such as patterns or irregularities, among multiple datasets. For example, multiple datasets may be analyzed for common characteristics that may represent patterns, trends, or irregularities over two or more datasets.

The composite analysis may comprise any appropriate analysis for analyzing test data for common characteristics among the datasets, and may be implemented in any suitable manner. For example, in the present testing system 100, the computer 108 performs composite analysis of data derived from multiple wafers and/or lots. The test data for each wafer, lot, or other grouping forms a dataset. The composite analysis process is suitably implemented as a software module operating on the computer 108. The composite analysis process may be implemented, however, in any appropriate configuration, such as in a hardware solution or a combined hardware and software solution. Further, the composite analysis process may be executed on the test system computer 108 or a remote computer, such as an independent workstation or a third party's separate computer system. The composite analysis may be performed at run time, following the generation of one or more complete datasets, or upon a collection of data generated well before the composite analysis, including historical data.

The composite analysis may use any data from two or more datasets. Composite analysis can receive several sets of input data, including raw data and filtered or smoothed data, for each dataset, such as by executing multiple configurations through the classification engine. Once received, the input data is suitably filtered using a series of user-defined rules, which can be defined as mathematical expressions, formulas, or any other criteria. The data is then analyzed to identify patterns or irregularities in the data. The composite data may also be merged into other data, such as the raw data or analyzed data, to generate an enhanced overall dataset. The composite analysis may then provide an appropriate output report that may be used to improve the test process. For example, the output report may provide information relating to issues in a manufacturing and/or testing process.

In the present system, the computer 108 analyzes sets of wafer data in conjunction with user expressions or other suitable processes and a spatial analysis to build and establish composite maps that illustrate significant patterns or trends. Composite analysis can receive several different datasets and/or composite maps for any one set of wafers by executing multiple user configurations on the set of wafers.

Figure 13:
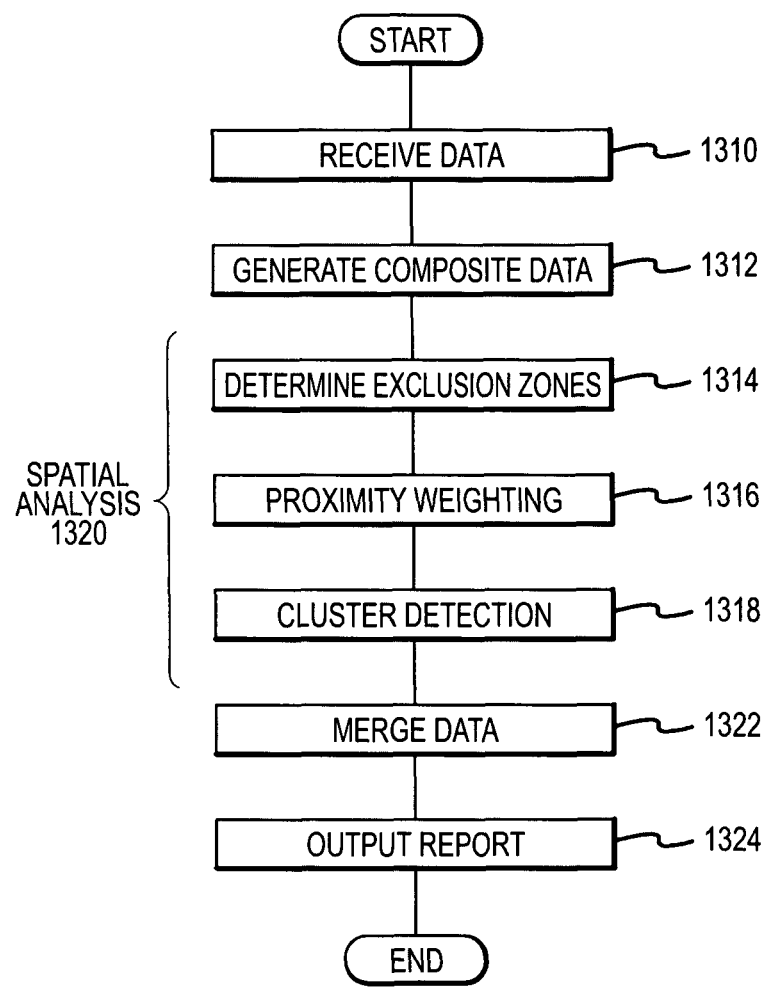
FIG. 13 is a flow diagram of a composite analysis process according to various aspects of the present invention.

Referring to FIG. 13, in the present embodiment operating in the semiconductor testing environment, the computer 108 receives data from multiple datasets, such as the data from multiple wafers or lots (1310). The data may comprise any suitable data for analysis, such as raw data, filtered data to remove global and/or local outliers, smoothed data, historical data from prior test runs, or data received from the tester at run time. In the present embodiment, the computer 108 receives raw data and filtered data at run time. The filtered data may comprise any suitable data for analysis, such as smoothed data and/or signature analysis data. In the present embodiment, the computer 108 receives the raw dataset and supplementary data, such as the smoothed data, identification of failures, identification of global and local outliers, signature analysis data, and/or other data.

After receiving the raw data and the supplementary data, the computer 108 generates composite data for analysis (1312). The composite data comprises data representative of information from more than one dataset. For example, the composite data may comprise summary information relating to the number of failures and/or outliers for a particular test occurring for corresponding test data in different datasets, such as data for components at identical or similar positions on different wafers or in different lots. The composite data may, however, comprise any appropriate data, such as data relating to areas having concentrations of outliers or failures, wafer locations generating a significant number of outliers or failures, or other data derived from two or more datasets.

The composite data is suitably generated by comparing data from the various datasets to identify patterns and irregularities among the datasets. For example, the composite data may be generated by an analysis engine configured to provide and analyze the composite data according to any suitable algorithm or process. In the present embodiment, the composite analysis element 214 includes a proximity engine configured to generate one or more composite masks based on the datasets. The composite analysis element 214 may also process the composite mask data, for example to refine or emphasize information in the composite mask data.

In the present embodiment, the proximity engine receives multiple datasets, either through a file, memory structure, database, or other data store, performs a spatial analysis on those datasets (1320), and outputs the results in the form of a composite mask. The proximity engine may generate the composite mask data, such as a composite image for an overall dataset, according to any appropriate process or technique using any appropriate methods. In particular, the proximity engine suitably merges the composite data with original data (1322) and generates an output report for use by the user or another system (1324). The proximity engine may also be configured to refine or enhance the composite mask data for analysis, such as by spatial analysis, analyzing the data for recurring characteristics in the datasets, or removing data that does not meet selected criteria.

In the present embodiment, the proximity engine performs composite mask generation 1312, and may also be configured to determine exclusion areas 1314, perform proximity weighting 1316, and detect and filter clusters 1318. The proximity engine may also provide proximity adjustment or other operations using user-defined rules, criteria, thresholds, and precedence. The result of the analysis is a composite mask of the inputted datasets that illustrates spatial trends and/or patterns found throughout the datasets given. The proximity engine can utilize any appropriate output method or medium, including memory structures, databases, other applications, and file-based data stores such as text files or XML files in which to output the composite mask.

The proximity engine may use any appropriate technique to generate the composite mask data, including cumulative squared methods, N-points formulas, Western Electrical rules, or other user defined criteria or rules. In the present embodiment, composite mask data may be considered as an overall encompassing or "stacked" view of multiple datasets. The present proximity engine collects and analyzes data for corresponding data from multiple datasets to identify potential relationships or common characteristics in the data for the particular set of corresponding data. The data analyzed may be any appropriate data, including the raw data, smoothed data, signature analysis data, and/or any other suitable data.

Figure 14:
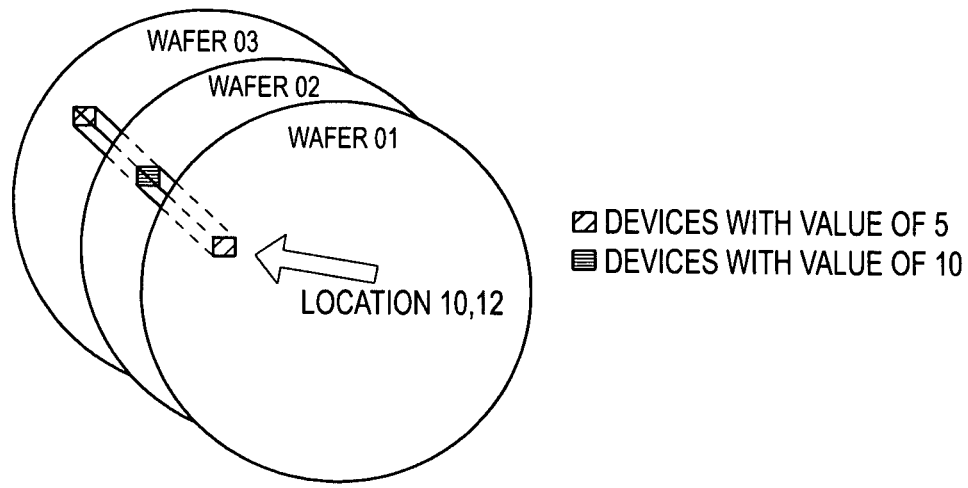
FIG. 14 is a diagram of a representative data point location on three representative wafers.

In the present embodiment, the proximity engine analyzes data for corresponding locations on multiple wafers. Referring to FIG. 14, each wafer has devices in corresponding locations that may be designated using an appropriate identification system, such as an x, y coordinate system. Thus, the proximity engine compares data for devices at corresponding locations or data points, such as location 10, 12 as shown in FIG. 14, to identify patterns in the composite set of data.

The proximity engine of the present embodiment uses at least one of two different techniques for generating the composite mask data, a cumulative squared method and a formula-based method. The proximity engine suitably identifies data of interest by comparing the data to selected or calculated thresholds. In one embodiment, the proximity engine compares the data points at corresponding locations on the various wafers and/or lots to thresholds to determine whether the data indicate potential patterns across the datasets. The proximity engine compares each datum to one or more thresholds, each of which may be selected in any appropriate manner, such as a predefined value, a value calculated based on the current data, or a value calculated from historical data.

Figure 15C:
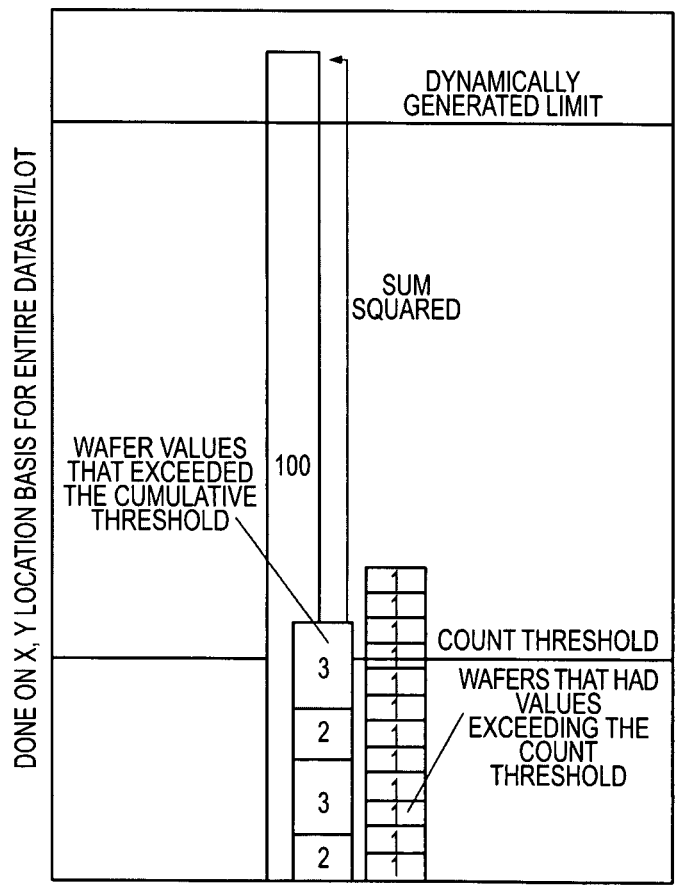
FIGS. 15A-C are a flow diagram and a chart relating to a cumulative squared composite data analysis process.
Figure 15A:
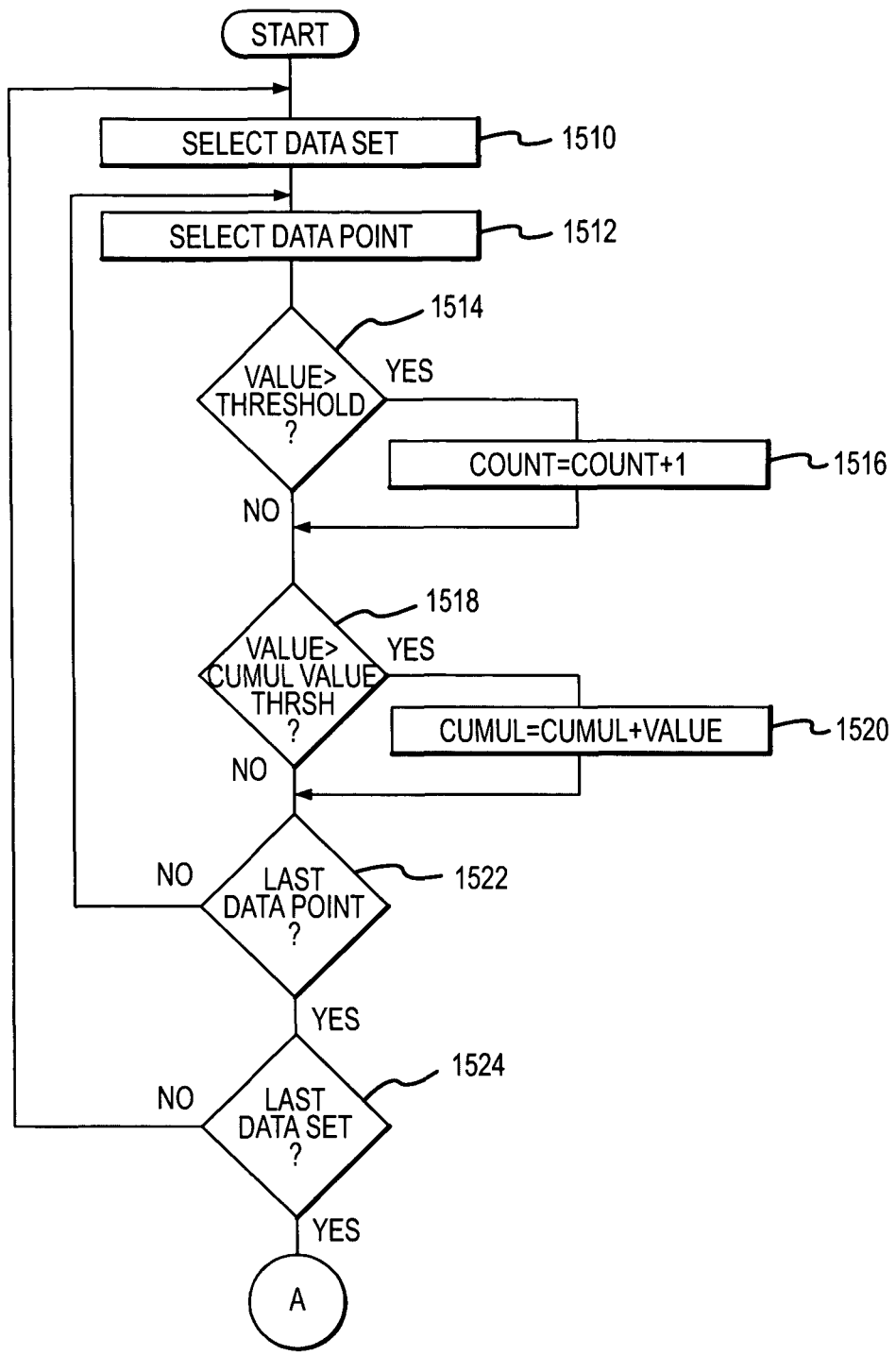
Figure 15B:
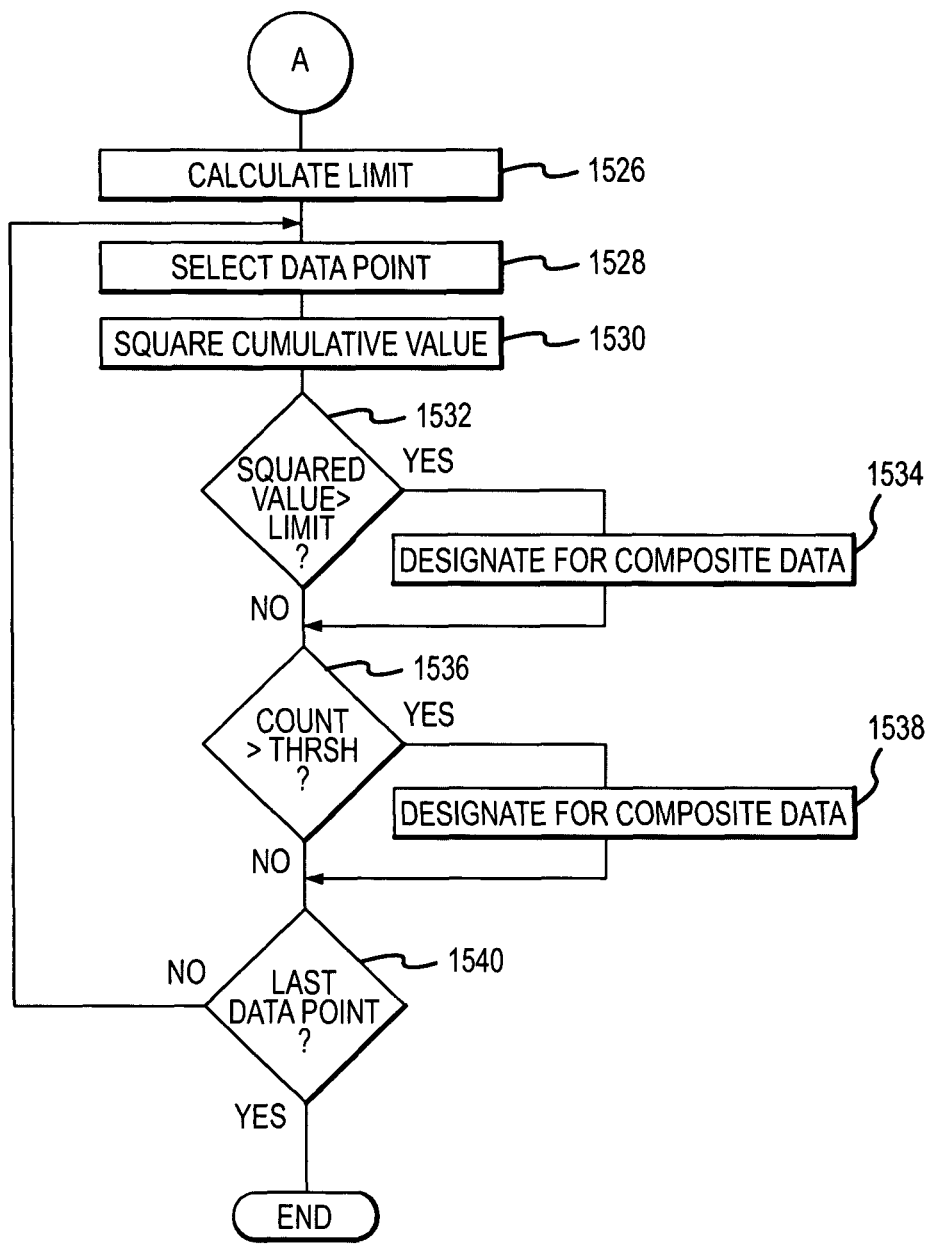

For example, a first embodiment of the present proximity engine implements a cumulative squared method to compare the data to thresholds. In particular, referring to FIGS. 15A-C, the proximity engine suitably selects a first data point (1512) in a first dataset (1510), such as a result for a particular test for a particular device on a particular wafer in a particular lot, and compares the data point value to a count threshold (1514). The threshold may comprise any suitable value, and any type of threshold, such as a range, a lower limit, an upper limit, and the like, and may be selected according to any appropriate criteria. If the data point value exceeds the threshold, i.e., is lower than the threshold, higher than the threshold, within the threshold limits, or whatever the particular qualifying relationship may be, an absolute counter is incremented (1516) to generate a summary value corresponding to the data point.

The data point value is also compared to a cumulative value threshold (1518). If the data point value exceeds the cumulative value threshold, the data point value is added to a cumulative value for the data point (1520) to generate another summary value for the data point. The proximity engine repeats the process for every corresponding data point (1522) in every relevant dataset (1524), such as every wafer in the lot or other selected group of wafers. Any other desired tests or comparisons may be performed as well for the data points and datasets.

When all of the relevant data points in the population have been processed, the proximity engine may calculate values based on the selected data, such as data exceeding particular thresholds. For example, the proximity engine may calculate overall cumulative thresholds for each set of corresponding data based on the cumulative value for the relevant data point (1526). The overall cumulative threshold may be calculated in any appropriate manner to identify desired or relevant characteristics, such as to identify sets of corresponding data points that bear a relationship to a threshold. For example, the overall cumulative threshold (Limit) may be defined according to the following equation:

$$\text{Limit} = \text{Average} + \frac{(ScaleFactor * \text{Standard } Deviation^2)}{(\text{Max} - \text{Min})}$$

where Average is the mean value of the data in the composite population of data, Scale Factor is a value or variable selected to adjust the sensitivity of the cumulative squared method, Standard Deviation is the standard deviation of data point values in the composite population of data, and (Max–Min) is the difference between the highest and lowest data point values in the complete population of data. Generally, the overall cumulative threshold is defined to establish a comparison value for identifying data points of interest in the particular data set.

Upon calculation of the overall cumulative threshold, the proximity engine determines whether to designate each data point for inclusion in the composite data, for example by comparing the count and cumulative values to thresholds. The proximity engine of the present embodiment suitably selects a first data point (1528), squares the total cumulative value for the data point (1530), and compares the squared cumulative value for the data point to the dynamically generated overall cumulative threshold (1532). If the squared cumulative value exceeds the overall cumulative threshold, then the data point is designated for inclusion in the composite data (1534).

The absolute counter value for the data point may also be compared to an overall count threshold (1536), such as a pre-selected threshold or a calculated threshold based on, for example, a percentage of the number of wafers or other datasets in the population. If the absolute counter value exceeds the overall count threshold, then the data point may again be designated for inclusion in the composite data (1538). The process is suitably performed for each data point (1540).

The proximity engine may also generate the composite mask data using other additional or alternative techniques. The present proximity engine may also utilize a formula-based system for generating the composite mask data. A formula-based system according to various aspects of the present invention uses variables and formulas, or expressions, to define a composite wafer mask.

For example, in an exemplary formula-based system, one or more variables may be user-defined according to any suitable criteria. The variables are suitably defined for each data point in the relevant group. For example, the proximity engine may analyze each value in the data population for the particular data point, for example to calculate a value for the data point or count the number of times a calculation provides a particular result. The variables may be calculated for each data point in the dataset for each defined variable.

After calculating the variables, the data points may be analyzed, such as to determine whether the data point meets the user-defined criteria. For example, a user-defined formula may be resolved using the calculated variable values, and if the formula equates to a particular value or range of values, the data point may be designated for inclusion in the composite mask data.

Thus, the proximity engine may generate a set of composite mask data according to any suitable process or technique. The resulting composite mask data comprises a set of data that corresponds to the results of the data population for each data point. Consequently, characteristics for the data point may be identified over multiple datasets. For example, in the present embodiment, the composite mask data may illustrate particular device locations that share characteristics on multiple wafers, such as widely variable test results or high failure rates. Such information may indicate issues or characteristics in the manufacturing or design process, and thus may be used to improve and control manufacturing and testing.

The composite mask data may also be analyzed to generate additional information. For example, the composite mask data may be analyzed to illustrate spatial trends and/or patterns in the datasets and/or identify or filter significant patterns, such as filtering to reduce clutter from relatively isolated data points, enhancing or refining areas having particular characteristics, or filtering data having known characteristics. The composite mask data of the present embodiment, for example, may be subjected to spatial analyses to smooth the composite mask data and complete patterns in the composite mask data. Selected exclusion zones may receive particular treatment, such that composite mask data may be removed, ignored, enhanced, accorded lower significance, or otherwise distinguished from other composite mask data. A cluster detection process may also remove or downgrade the importance of data point clusters that are relatively insignificant or unreliable.

Figure 16:
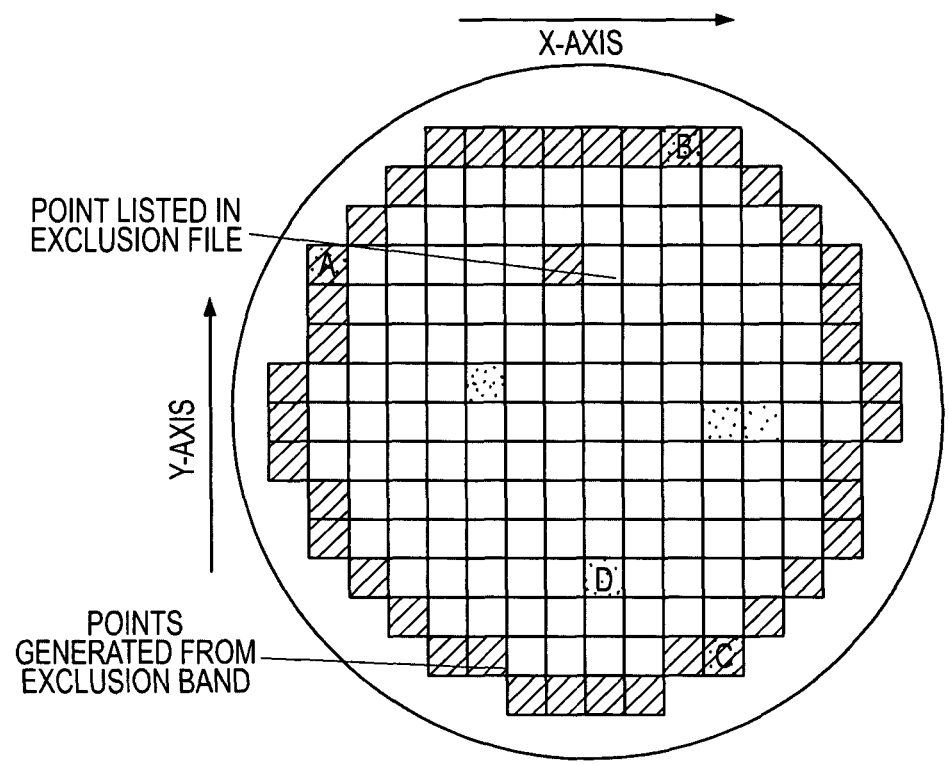
FIG. 16 is a diagram of an exclusion zone defined on a wafer.

In the present embodiment, the proximity engine may be configured to identify particular designated zones in the composite mask data such that data points from the designated zones are accorded particular designated treatment or ignored in various analyses. For example, referring to FIG. 16, the proximity engine may establish an exclusion zone at a selected location on the wafers, such as individual devices, groups of devices, or a band of devices around the perimeter of the wafer. The exclusion zone may provide a mechanism to exclude certain data points from affecting other data points in proximity analysis and/or weighting. The data points are designated as excluded in any suitable manner, such as by assigning values that are out of the range of subsequent processes.

The relevant zone may be identified in any suitable manner. For example, excluded data points may be designated using a file listing of device identifications or coordinates, such as x,y coordinates, selecting a particular width of band around the perimeter, or other suitable process for defining a relevant zone in the composite data. In the present embodiment, the proximity engine may define a band of excluded devices on a wafer using a simple calculation that causes the proximity engine to ignore or otherwise specially treat data points within a user defined range of the edge of the data set. For example, all devices within this range, or listed in the file, are then subject to selected exclusion criteria. If the exclusion criteria are met, the data points in the exclusion zone or the devices meeting the exclusion criteria are excluded from one or more analyses.

The proximity engine of the present embodiment is suitably configured to perform additional analyses upon the composite mask data. The additional analyses may be configured for any appropriate purpose, such as to enhance desired data, remove unwanted data, or identify selected characteristics in the composite mask data. For example, the proximity engine is suitably configured to perform a proximity weighting process, such as based on a point weighting system, to smooth and complete patterns in the composite mask data.

Figure 17A:
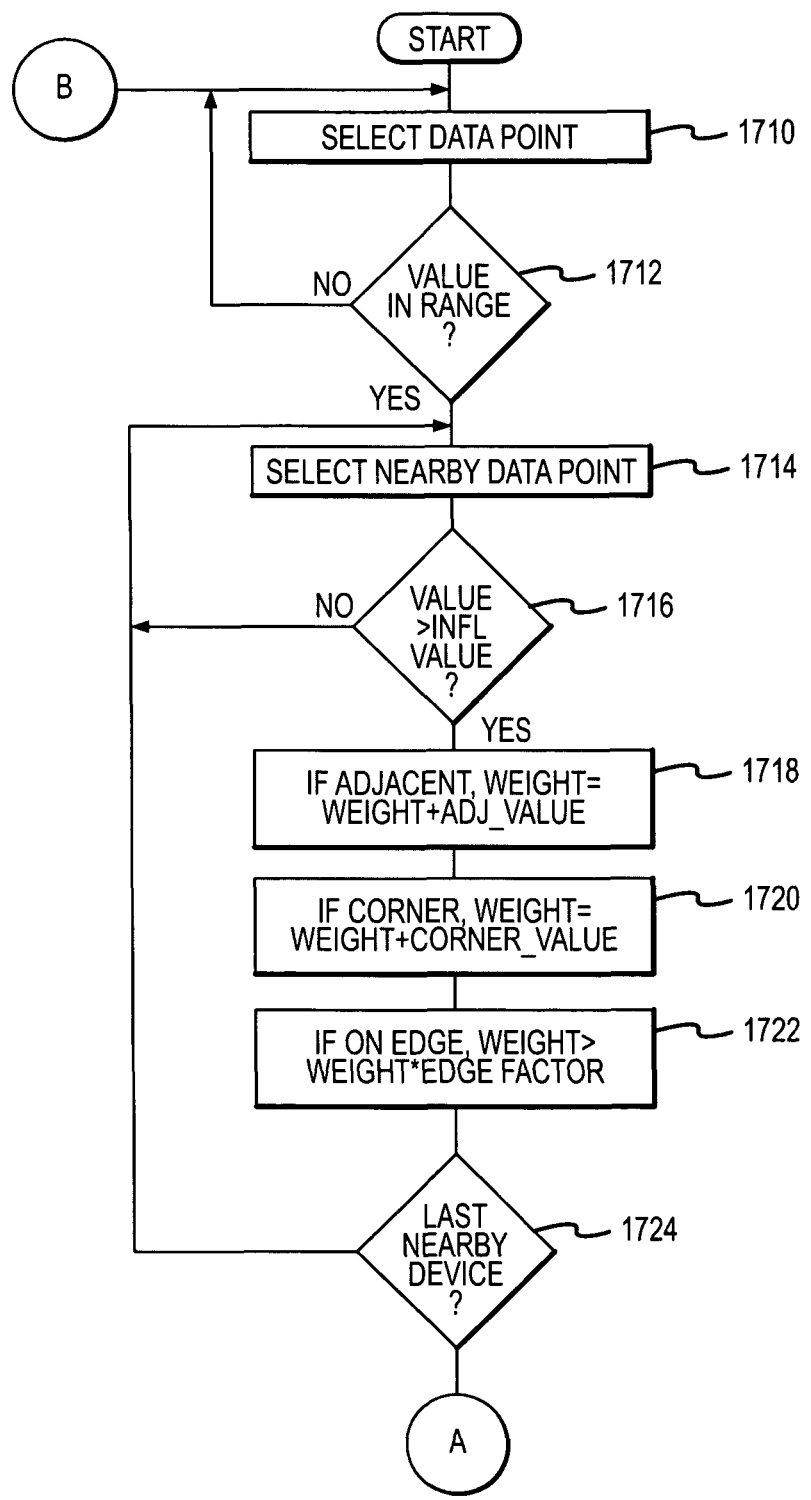
FIGS. 17A-B are a flow diagram of a proximity weighting process.
Figure 17B:
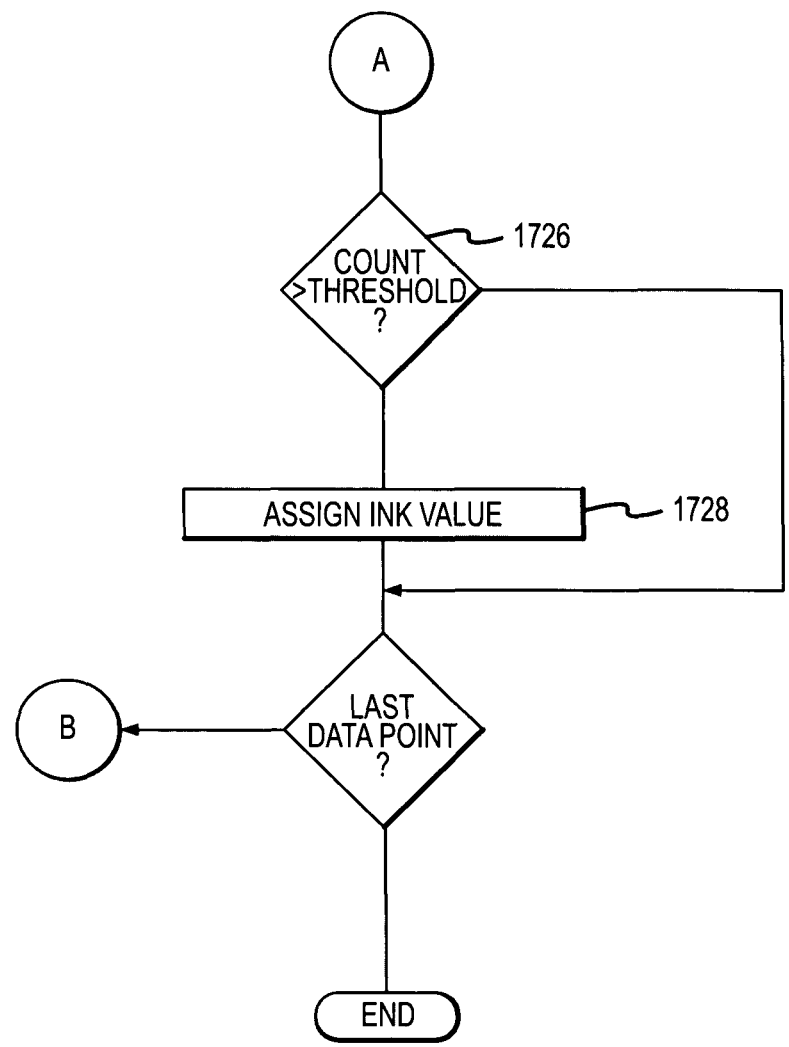
Figure 18:
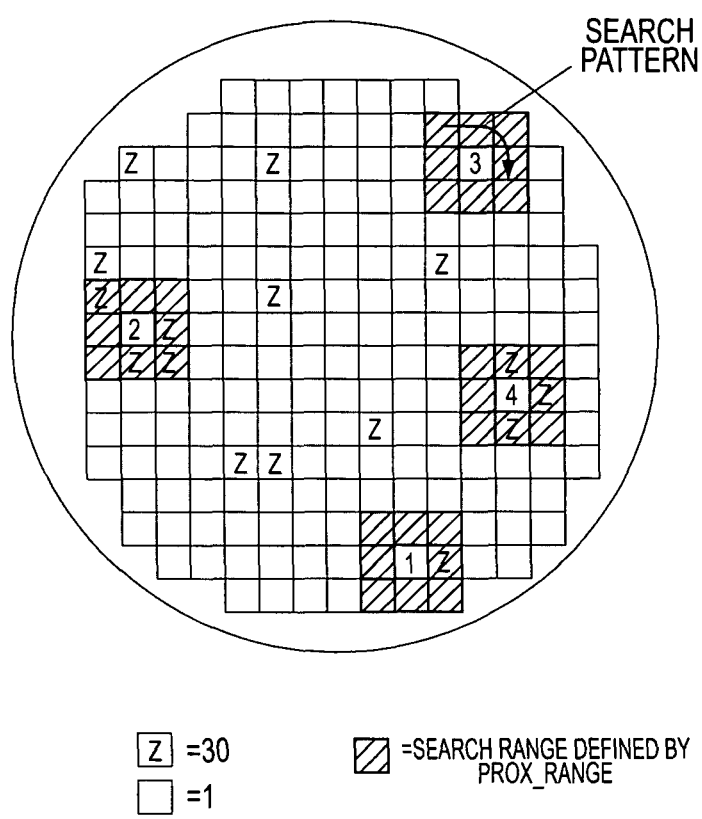
FIG. 18 is a diagram of a set of data points subjects to proximity weighting.

Referring to FIGS. 17A-B and 18, the present proximity engine searches through all data points in the dataset. The proximity engine selects a first point (1710) and checks the value of the data point against a criterion, such as a threshold or a range of values (1712). When a data point is found that exceeds the selected threshold or is within the selected range, the proximity engine searches data points surrounding the main data point for values (1714). The number of data points around the main data point may be any selected number, and may be selected according to any suitable criteria.

The proximity engine searches the surrounding data points for data points exceeding an influence value or satisfying another suitable criterion indicating that the data point should be accorded weight (1716). If the data point exceeds the influence value, the proximity engine suitably assigns a weight to the main data point according to the values of the surrounding data points. In addition, the proximity engine may adjust the weight according to the relative position of the surrounding data point. For example, the amount of weight accorded to a surrounding data point can be determined according to whether the surrounding data point is adjacent (1718) or diagonal (1720) to the main data point. The total weight may also be adjusted if the data point is on the edge of the wafer (1722). When all surrounding data points around the main data point have been checked (1724), the main data point is assigned an overall weight, for example by adding the weight factors from the surrounding data points. The weight for the main data point may then be compared to a threshold, such as a user defined threshold (1726). If the weight meets or exceeds the threshold, the data point is so designated (1728).

The composite mask data may also be further analyzed to filter data. For example, in the present embodiment, the proximity engine may be configured to identify, and suitably remove, groups of data points that are smaller than a threshold, such as a user-specified threshold.

Figure 19:
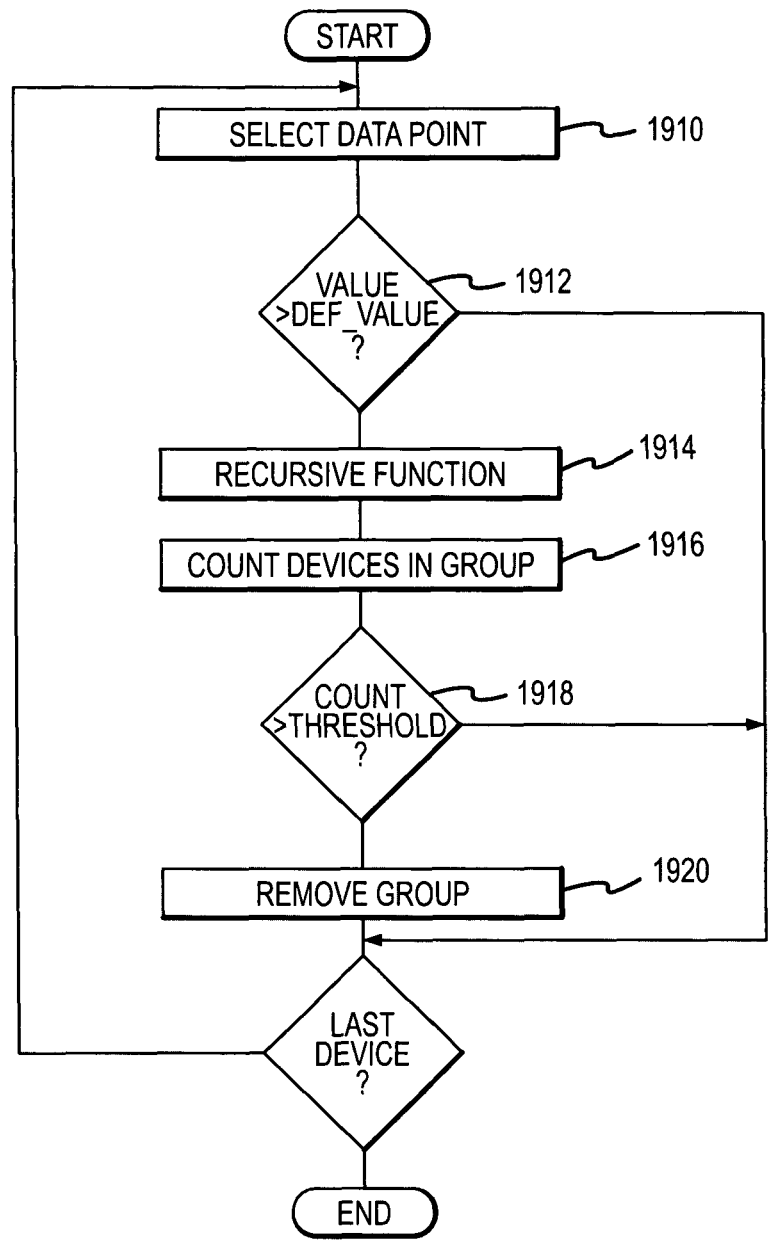
FIG. 19 is a flow diagram of a cluster detection and filtration process.
Figure 20:
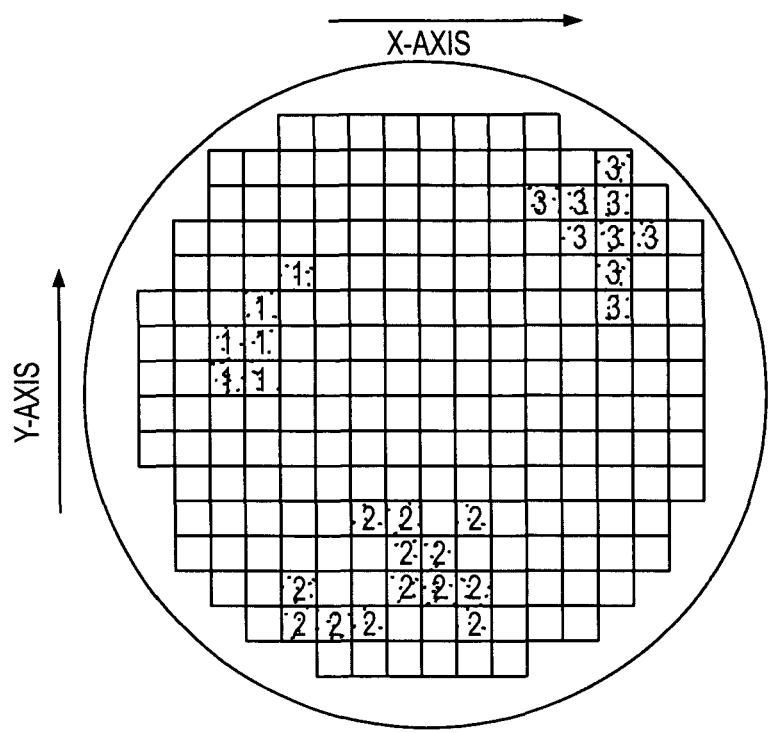
FIG. 20 is a diagram of a set of clusters on a wafer subject to detection and filtration.

Referring to FIGS. 19 and 20, the proximity engine of the present embodiment may be configured to define the groups, size them, and remove smaller groups. To define the groups, the proximity engine searches through every data point in the composite mask data for a data point satisfying a criterion. For example, the data points in the composite mask data may be separated into ranges of values and assigned index numbers. The proximity engine begins by searching the composite mask data for a data point matching a certain index (1910). Upon encountering a data point meeting designated index (1912), the proximity engine designates the found point as the main data point and initiates a recursive program that searches in all directions from the main data point for other data points that are in the same index, or alternatively, have substantially the same value, also exceed the threshold, or meet other desired criteria (1914).

As an example of a recursive function in the present embodiment, the proximity engine may begin searching for data points having a certain value, for instance five. If a data point with a value of five is found, the recursive program searches all data points around the main device until it finds another data point with the value of five. If another qualifying data point is found, the recursive program selects the encountered data point as the main data point and repeats the process. Thus, the recursive process analyzes and marks all data points having matching values that are adjacent or diagonal to each other and thus form a group. When the recursive program has found all devices in a group having a certain value, the group is assigned a unique group index and the proximity engine again searches through the entire composite mask data. When all of the data values have been searched, the composite mask data is fully separated into groups of contiguous data points having the same group index.

The proximity engine may determine the size of each group. For example, the proximity engine may count the number of data points in the group (1916). The proximity engine may then compare the number of data points in each group to a threshold and remove groups that do not meet the threshold (1918). The groups may be removed from the grouping analysis in any suitable manner (1920), such as by resetting the index value for the relevant group to a default value. For example, if the threshold number of data points is five, the proximity engine changes the group index number for every group having fewer than five data points to a default value. Consequently, the only groups that remain classified with different group indices are those having five or more data points.

The proximity engine may perform any appropriate additional operations to generate and refine the composite mask data. For example, the composite mask data, including the results of the additional filtering, processing, and analyzing of the original composite mask data, may be used to provide information relating to the multiple datasets and the original source of the data, such as the devices on the wafers or the fabrication process. The data may be provided to the user or otherwise used in any suitable manner. For example, the data may be provided to another system for further analysis or combination with other data, such as executing user-defined rules combined with a merging operation on the composite mask data, the raw data, and any other appropriate data to produce a data set that represents trends and patterns in the raw data. Further, the data may be provided to a user via an appropriate output system, such as a printer or visual interface.

In the present embodiment, for example, the composite mask data is combined with other data and provided to the user for review. The composite mask data may be combined with any other appropriate data in any suitable manner. For example, the composite mask data may be merged with signature data, the raw data, hardware bin data, software bin data, and/or other composite data. The merging of the datasets may be performed in any suitable manner, such as using various user-defined rules including expressions, thresholds, and precedence.

Figure 21:
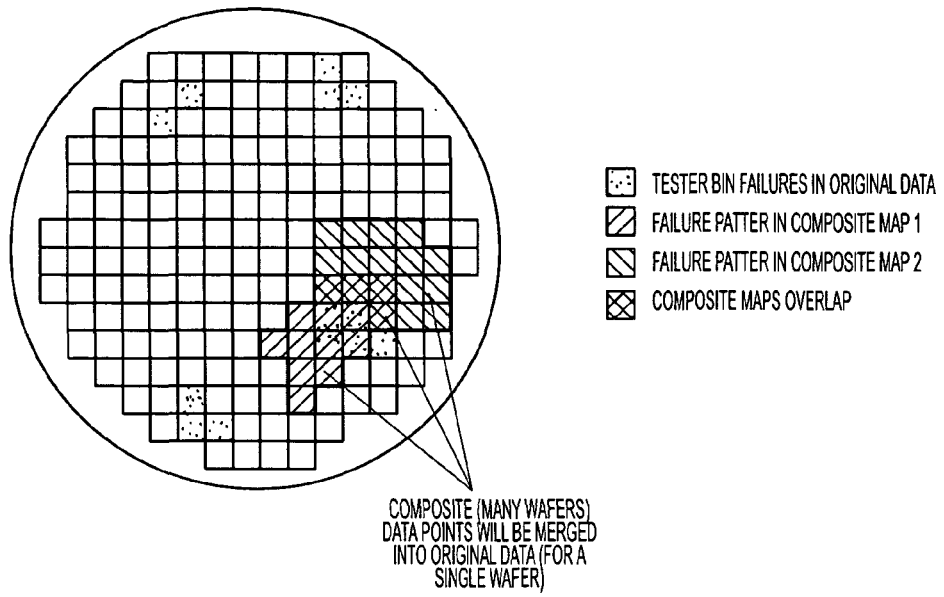
FIG. 21 is a diagram of a set of data points merged using an absolute merge process.

In the present system, the computer 108 performs the merging process using an appropriate process to merge the composite mask data with an original map of composite data, such as a map of composite raw data, composite signature data, or composite bin data. For example, referring to FIG. 21, the composite analysis element 214 may merge the composite mask data with the original individual wafer data using an absolute merge system in which the composite mask data is fully merged with the original data map. Consequently, the composite mask data is merged with the original data map regardless of overlap or encompassment of existing patterns. If only one composite mask illustrates a pattern out of multiple composite masks, the pattern is included in the overall composite mask.

Figure 22:
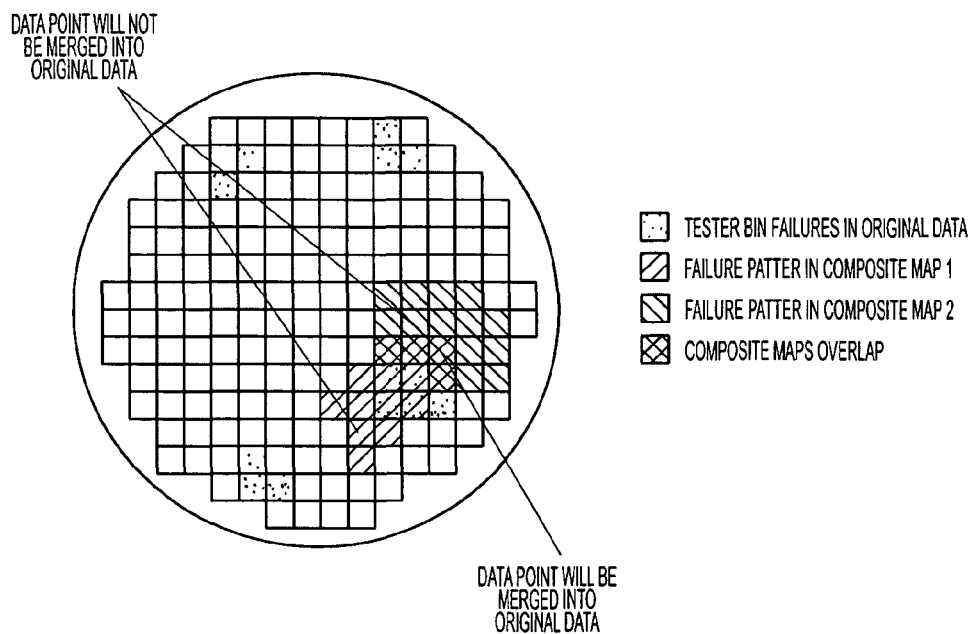
FIG. 22 is a diagram of a set of data points merged using an overlap merge process.

Alternatively, the composite analysis element 214 may merge the data in conjunction with additional analysis. The composite analysis element 214 may filter data that may be irrelevant or insignificant. For example, referring to FIG. 22, the composite analysis element 214 may merge only data in the composite mask data that overlaps data in the original data map or in another composite mask, which tends to emphasize potentially related information.

Figure 23:
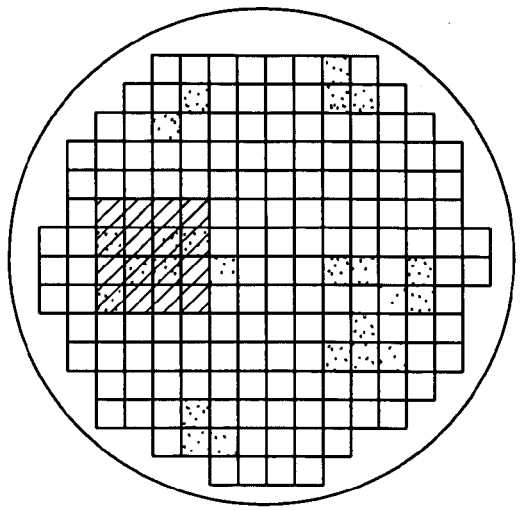
FIGS. 23 and 24 are diagrams of sets of data points merged using percentage overlap merge processes.
Figure 24:
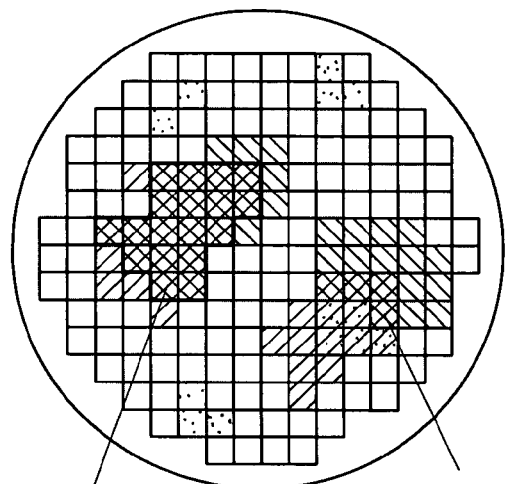

The composite analysis element 214 may alternatively evaluate the composite mask data and the original data to determine whether a particular threshold number, percentage, or other value of data points overlap between maps. Depending on the configuration, the data merged may only include areas where data points, in this case corresponding to devices, overlapped sufficiently between the composite mask data and the original data to meet the required threshold value for overlapping data points. Referring to FIG. 23, the composite analysis element 214 may be configured to include only composite data patterns that overlap to a sufficient degree with tester bin failures, i.e., failed devices, in the original data, such as 50% of the composite data overlapping with tester bin failure data. Thus, if less than the minimum amount of composite data overlaps with the original data, the composite data pattern may be ignored. Similarly, referring to FIG. 24, the composite analysis element 214 may compare two different sets of composite data, such as data from two different recipes, and determine whether the overlap between the two recipes satisfies selected criteria. Only the data that overlaps and/or satisfies the minimum criteria is merged.

The merged data may be provided for output to the user or other system. The merged data may be passed as input to another process, such as a production error identification process or a large trend identification process. The merged data may also be outputted in any assortment or format, such as memory structures, database tables, flat text files, or XML files.

In the present embodiment, the merged data and/or wafer maps are provided to an ink map generation engine. The ink map engine produces maps for offline inking equipment. In addition to offline inking maps, the merged data results may be utilized in generating binning results for inkless assembly of parts, or any other process or application that utilizes these types of results.

The particular implementations shown and described are merely illustrative of the invention and its best mode and are not intended to otherwise limit the scope of the present invention in any way. For the sake of brevity, conventional signal processing, data transmission, and other functional aspects of the systems (and components of the individual operating components of the systems) may not be described in detail. Furthermore, the connecting lines shown in the various figures are intended to represent exemplary functional relationships and/or physical couplings between the various elements. Many alternative or additional functional relationships or physical connections may be present in a practical system. The present invention has been described above with reference to a preferred embodiment. Changes and modifications may be made, however, without departing from the scope of the present invention. These and other changes or modifications are intended to be included within the scope of the present invention, as expressed in the following claims.

The invention claimed is:

1. A data analysis system for semiconductor test data, comprising a computer system, wherein the computer system is configured to operate:
   a local outlier identification system configured to:
      select a data subset from the semiconductor test data corresponding to a spatially-related subgroup of components on a substrate, wherein the spatially-related subgroup of components comprises a group of adjacent components within an area defined on the substrate that is fewer than all of the components on the substrate; and
      automatically identify a local outliers in the data subset, wherein the local outlier comprises an outlier relative to the selected data subset.

2. The test system of claim 1, wherein the local outlier identification system is configured to normalize the test data.

3. The test system of claim 1, wherein the local outlier identification system is configured to identify the local outliers according to a local median and a local interquartile range of the data subset.

4. The test system of claim 1, wherein the local outlier identification system is configured to select the data subset according to a spatial pattern.

5. The test system of claim 4, wherein the local outlier identification system is configured to automatically adjust at least one of a size and a shape of the spatial pattern.

6. The test system of claim 4, wherein:
   the spatial pattern defines a central component; and
   the local outlier identification system is configured to identify the local outliers in the data subset by comparing the test data for the central component to a threshold value derived from a median value for the test data for the non-central components in the data subset.

7. The test system of claim 1, wherein the local outlier identification system is configured to automatically select an outlier identification algorithm for identifying the local outliers from a plurality of candidate outlier identification algorithms.

8. The test system of claim 1, wherein the local outlier identification system is configured to assign a category to a selected component according to at least one of a magnitude and a number of at least one of one or more global outliers and one or more local outliers identified in the test data for the component.

9. A data analysis system for semiconductor test data, comprising a computer system, wherein the computer system is configured to operate:
   a local outlier identification system configured to:
      select test data for a spatially-related subgroup of components on a selected wafer, wherein the spatially-related subgroup of components comprises a group of adjacent components within an area defined on the wafer that is fewer than all of the components on the selected wafer; and
      identify local outliers in the selected test data, wherein the local outliers comprise an outlier relative to the selected test data.

10. The test system of claim 9, wherein the local outlier identification system is configured to normalize the test data.

11. The test system of claim 9, wherein the local outlier identification system is configured to identify the local outliers according to a local median and a local interquartile range of the selected data.

12. The test system of claim 9, wherein the local outlier identification system is configured to select the selected data according to a spatial pattern.

13. The test system of claim 12, wherein the local outlier identification system is configured to automatically adjust at least one of a size and a shape of the spatial pattern.

14. The test system of claim 12, wherein:
   the spatial pattern defines a central component; and
   the local outlier identification system is configured to identify the local outliers in the selected data by comparing the test data for the central component to a threshold value derived from a median value for the test data for the non-central components in the selected data.

15. The test system of claim 9, wherein the local outlier identification system is configured to automatically select an outlier identification algorithm for identifying the local outliers from a plurality of candidate outlier identification algorithms.

16. The test system of claim 9, wherein the local outlier identification system is configured to assign a category to a selected component according to at least one of a magnitude and a number of at least one of one or more global outliers and one or more local outliers identified in the test data for the component.

17. A test data analysis system for analyzing test data for a set of components fabricated and tested using a fabrication process, comprising:
   a memory for storing the test data; and
   a local outlier identification system having access to the memory and configured to:
      select a portion of the test data corresponding to a group of spatially-related components on a single substrate comprising a group of adjacent components within a defined area on the single substrate that is fewer than all of the components on the substrate; and
      identify local outliers in the selected portion, wherein the local outliers comprise an outlier relative to the selected portion of the test data.

18. The test data analysis system of claim 17, wherein the local outlier identification system is configured to normalize the test data.

19. The test data analysis system of claim 17, wherein the local outlier identification system is configured to identify the local outliers according to a local median and a local interquartile range of the portion of the test data.

20. The test data analysis system of claim 17, wherein the local outlier identification system is configured to select the portion of the test data according to a spatial pattern.

21. The test data analysis system of claim 20, wherein the local outlier identification system is configured to automatically adjust at least one of a size and a shape of the spatial pattern.

22. The test data analysis system of claim 20, wherein:
   the spatial pattern defines a central component; and
   the local outlier identification system is configured to identify the local outliers in the portion of the test data by comparing the test data for the central component to a threshold value derived from a median value for the test data for the non-central components in the portion of the test data.

23. The test data analysis system of claim 17, wherein the local outlier identification system is configured to automatically select an outlier identification algorithm for identifying the local outliers from a plurality of candidate outlier identification algorithms.

24. The test data analysis system of claim 17, wherein the local outlier identification system is configured to assign a category to a selected component according to at least one of a magnitude and a number of at least one of one or more global outliers and one or more local outliers identified in the test data for the component.

25. A computer-implemented method for testing components on a selected substrate fabricated and tested according to a fabrication process, comprising:
   obtaining test data for the components;
   selecting a subset of the test data corresponding to a spatially-related subgroup of components on the selected substrate, wherein the subgroup comprises a group of adjacent components within a defined area on the substrate that is fewer than all of the components on the substrate;
   automatically identifying local outliers in the selected subset of test data, wherein the local outliers comprise an outlier relative to the selected subset of the test data; and
   storing information identifying the outliers in a computer readable medium.

26. The computer-implemented method of claim 25, further comprising normalizing the test data.

27. The computer-implemented method of claim 25, wherein identifying the local outliers comprises determining a local outlier threshold according to a local median and a local interquartile range of the data subset.

28. The computer-implemented method of claim 25, wherein selecting the subset comprises selecting the data subset according to a spatial pattern.

29. The computer-implemented method of claim 28, wherein selecting the subset further comprises automatically adjusting at least one of a size and a shape of the spatial pattern.

30. The computer-implemented method of claim 28, wherein:
   the spatial pattern defines a central component; and
   identifying the local outliers in the data subset comprises comparing the test data for the central component to a threshold value derived from a median value for the test data for the non-central components in the data subset.

31. The computer-implemented method of claim 25, further comprising automatically selecting an outlier identification algorithm for identifying the local outliers from a plurality of candidate outlier identification algorithms.

32. The computer-implemented method of claim 25, further comprising assigning a category to a selected component according to at least one of a magnitude and a number of at least one of one or more global outliers and one or more local outliers identified in the test data for the component.

33. A non-transitory computer-readable medium storing instructions executable by a computer, wherein the instructions cause the computer to execute a method for analyzing test data comprising:

obtaining test data for the components on a selected substrate;

selecting a portion of the test data corresponding to geographically-related components on the selected substrate, wherein the selected portion comprises a group of adjacent components within a defined area on the substrate that corresponds to fewer than all of the components on the selected substrate; and identifying a local outlier in the selected portion of the test data, wherein the local outliers comprise an outlier relative to the selected portion of the test data.

34. The computer-readable medium storing instructions of claim 33, the method further comprising the step of normalizing the test data.

35. The computer-readable medium storing instructions of claim 33, wherein identifying the local outlier comprises determining a local outlier threshold according to a local median and a local interquartile range of the portion of the test data.

36. The computer-readable medium storing instructions of claim 33, wherein selecting the portion of the test data comprises selecting the portion of the test data according to a spatial pattern.

37. The computer-readable medium storing instructions of claim 36, wherein selecting the portion of the test data further comprises automatically adjusting at least one of a size and a shape of the spatial pattern.

38. The computer-readable medium storing instructions of claim 36, wherein:

the spatial pattern defines a central component; and identifying the local outlier in the portion of the test data comprises comparing the test data for the central component to a threshold value derived from a median value for the test data for the non-central components in the portion of the test data.

39. The computer-readable medium storing instructions of claim 33, the method further comprising automatically selecting an outlier identification algorithm for identifying the local outlier from a plurality of candidate outlier identification algorithms.

40. The computer-readable medium storing instructions of claim 33, the method further comprising assigning a category to a selected component according to at least one of a magnitude and a number of at least one of one or more global outliers and one or more local outliers identified in the test data for the component.

* * * * *